US008202994B2

(12) United States Patent
Qu et al.

(10) Patent No.: US 8,202,994 B2
(45) Date of Patent: Jun. 19, 2012

(54) PENTARYLENE- AND HEXARYLENETETRACARBOXIMIDES AND PREPARATION THEREOF

(75) Inventors: Jianqiang Qu, Ludwigshafen (DE); Neil Gregory Pschirer, Mainz (DE); Ruediger Sens, Ludwigshafen (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 358 days.

(21) Appl. No.: 12/513,367

(22) PCT Filed: Oct. 30, 2007

(86) PCT No.: PCT/EP2007/061652
§ 371 (c)(1),
(2), (4) Date: May 4, 2009

(87) PCT Pub. No.: WO2008/052981
PCT Pub. Date: May 8, 2008

(65) Prior Publication Data
US 2010/0059716 A1  Mar. 11, 2010

(30) Foreign Application Priority Data
Nov. 2, 2006 (EP) .................. 06123387

(51) Int. Cl.
C07D 471/00 (2006.01)
C07D 471/04 (2006.01)
D06P 1/10 (2006.01)
F21V 9/04 (2006.01)

(52) U.S. Cl. .............. 546/41; 546/56; 252/587; 8/636
(58) Field of Classification Search .......... None
See application file for complete search history.

(56) References Cited

U.S. PATENT DOCUMENTS

| | | | |
|---|---|---|---|
| 5,405,962 A | 4/1995 | Muellen et al. | |
| 5,986,099 A | 11/1999 | Mullen et al. | |
| 8,071,775 B2 * | 12/2011 | Koenemann et al. | 546/26 |
| 2004/0049030 A1 | 3/2004 | Bohm et al. | |
| 2008/0167467 A1 * | 7/2008 | Konemann et al. | 546/26 |
| 2008/0188660 A1 | 8/2008 | Pschirer et al. | |

FOREIGN PATENT DOCUMENTS

| | | |
|---|---|---|
| DE | 42 36 885 | 5/1994 |
| DE | 10 2005 018 241 | 10/2006 |
| EP | 1 373 272 | 1/2004 |
| WO | 96 22332 | 7/1996 |
| WO | 02 077081 | 10/2002 |

OTHER PUBLICATIONS

Pschirer, N. G. et al., "Pentarylene- And Hexarylenebis(dicarboximide)s: Near-Infrared-Absorbing Polyaromatic Dyes", Angew. Chem. Int. Ed., vol. 45, pp. 1401-1404 (2006) XP 002474592.
Holtrup, F.O. et al., "Terylenimides: New NIR Fluorescent Dyes", Chemistry—A European Journal, vol. 3, No. 2, pp. 219-225 (1997) XP 000931226.
Kohl, C. et al., "Bis(rylenedicarboximide)-a,d-1,5-Diaminoanthraquinones As Unique Infrafred Absorbing dyes", Chemical Communications, pp. 2778-2779 (2002) XP 002256670.
U.S. Appl. No. 12/668,975, filed Jan. 13, 2010, Pschirer, et al.
U.S. Appl. No. 12/738,947, filed Apr. 20, 2010, Koenemann, et al.

* cited by examiner

Primary Examiner — Kamal Saeed
Assistant Examiner — Nyeemah A Grazier
(74) Attorney, Agent, or Firm — Oblon, Spivak, McClelland, Maier & Neustadt, L.L.P.

(57) ABSTRACT

The present invention relates to processes for preparing pentarylene- and hexarylenetetracarboximides of the general formula (I) or (Ia)

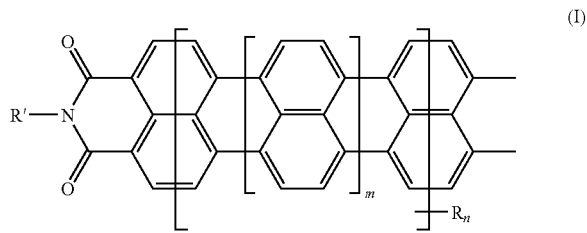

(I)

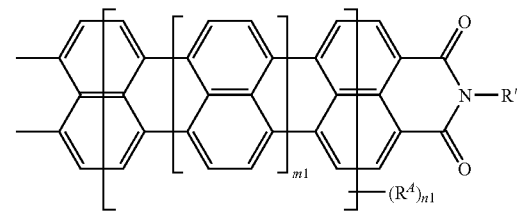

(Ia)

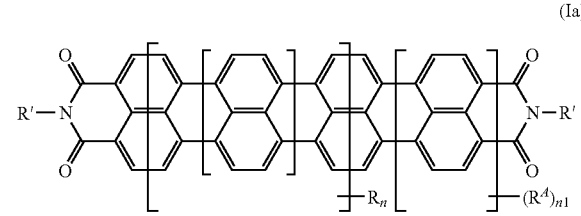

or mixtures thereof, to pentarylene and hexarylenetetracarboximides having a high degree of substitution, and to their use.

29 Claims, No Drawings

PENTARYLENE- AND HEXARYLENETETRACARBOXIMIDES AND PREPARATION THEREOF

The present invention relates to pentarylene- and hexarylenetetracarboximides, and to their preparation and use.

Rylenetetracarboximides are known to be of particular interest from an application point of view owing to their strong absorption in the near infrared (NIR) region of the electromagnetic spectrum.

For example, WO-A 02/77081 describes the use of quaterrylenetetracarboximides as infrared absorbers for heat protection in glass laminates.

Pentarylene- and hexarylene derivatives which are unsubstituted or have a low degree of substitution are described by N. G. Pschirer et al., Angew. Chem. Int. Ed. 45 (2006), 1401-1404.

Similar pentarylene- and hexarylene derivatives are also described in DE-A 10 2005 018241.

In spite of the pentarylene and hexarylene derivatives already described and their use in connection with their absorption capacity in the NIR, there is a need for further, especially highly substituted, derivatives, and for processes for their preparation.

It is thus an object of the present invention to provide such derivatives and processes for their preparation, which are of particular interest especially owing to their absorption capacity and should be easy to prepare owing to very simple preparation processes in spite of their comparatively high degree of substitution.

This object is achieved by a process for preparing pentarylene- and hexarylenetetracarboximides, comprising the steps of
(a) coupling at least one terrylene or quaterrylene compound of the formula (II)

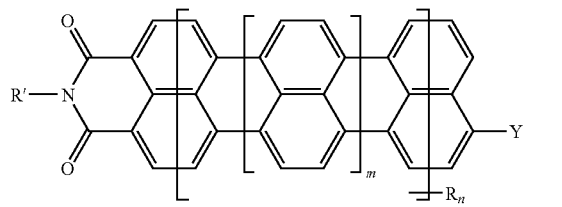

with at least one compound of the formula (III) or (IIIa)

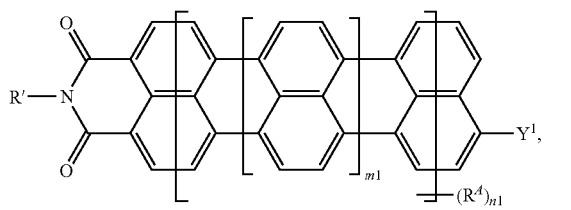

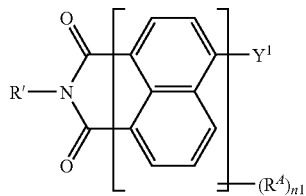

where
Y, $Y^1$ are each halogen, or one radical of Y, $Y^1$ is halogen and the other is $B(OR'')_2$;
each R, $R^A$ are independently identical or different radicals selected from the following:
aryloxy, arylthio, hetaryloxy or hetarylthio, to each of which may be fused further saturated or unsaturated 5- to 7-membered rings whose carbon skeleton may be interrupted by one or more —O—, —S—, —$NR^1$—, —N=$CR^1$—, —CO—, —SO— and/or —$SO_2$— moieties, where the entire ring system may be mono- or polysubstituted by the (i), (ii), (iii), (iv) and/or (v) radicals:
(i) $C_1$-$C_{30}$-alkyl whose carbon chain may be interrupted by one or more —O—, —S—, —$NR^1$—, —N=$CR^1$—, —C≡C—, —$CR^1$=$CR^1$—, —CO—, —SO— and/or —$SO_2$— moieties and which may be mono- or polysubstituted by: $C_1$-$C_{12}$-alkoxy, $C_1$-$C_6$-alkylthio, —C≡$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$, —$POR^2R^3$, aryl and/or saturated or unsaturated $C_4$-$C_7$-cycloalkyl whose carbon skeleton may be interrupted by one or more —O—, —S—, —$NR^1$—, —N=$CR^1$—, —$CR^1$=$CR^1$—, —CO—, —SO— and/or —$SO_2$— moieties, where the aryl and cycloalkyl radicals may each be mono- or polysubstituted by $C_1$-$C_{18}$-alkyl and/or the above radicals specified as substituents for alkyl;
(ii) $C_3$-$C_8$-cycloalkyl whose carbon skeleton may be interrupted by one or more —O—, —S—, —$NR^1$—, —N=$CR^1$—, —$CR^1$=$CR^1$—, —CO—, —SO— and/or —$SO_2$— moieties and to which may be fused further saturated or unsaturated 5- to 7-membered rings whose carbon skeleton may be interrupted by one or more —O—, —S—, —$NR^1$—, —N=$CR^1$—, —$CR^1$=$CR^1$—, —CO—, —SO— and/or —$SO_2$— moieties, where the entire ring system may be mono- or polysubstituted by: $C_1$-$C_{18}$-alkyl, $C_1$-$C_{12}$-alkoxy, $C_1$-$C_6$-alkylthio, —C≡$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$ and/or —$POR^2R^3$;
(iii) aryl or hetaryl to which may be fused further saturated or unsaturated 5- to 7-membered rings whose carbon skeleton may be interrupted by one or more —O—, —S—, —$NR^1$—, —N=$CR^1$—, —$CR^1$=$CR^1$—, —CO—, —SO— and/or —$SO_2$— moieties, where the entire ring system may be mono- or polysubstituted by: $C_1$-$C_{18}$-alkyl, $C_1$-$C_{12}$-alkoxy, $C_1$-$C_6$-alkylthio, —C≡$CR^1$, —$CR^1$=$CR^1{}_2$, hydroxyl, mercapto, halogen, cyano, nitro, —$NR^2R^3$, —$NR^2COR^3$, —CONR$^2$R$^3$, —SO$_2$NR$^2$R$^3$, —COOR$^2$, —SO$_3$R$^2$, —PR$^2$R$^3$, —POR$^2$R$^3$, aryl and/or hetaryl, each of which may be substituted by C$_1$-C$_{18}$-alkyl, C$_1$-C$_{12}$-alkoxy, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$, —SO$_3$R$^2$, —PR$^2$R$^3$ and/or —POR$^2$R$^3$;

(iv) a —U-aryl radical which may be mono- or polysubstituted by the above radicals specified as substituents for the aryl radicals (iii), where U is a —O—, —S—, —NR$^1$—, —CO—, —SO— or —SO$_2$— moiety;

(v) C$_1$-C$_{12}$-alkoxy, C$_1$-C$_8$-alkylthio, —C≡CR$^1$, —CR$^1$=CR$^1{}_2$, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$, —SO$_3$R$^2$, —PR$^2$R$^3$ and/or —POR$^2$R$^3$;

each R' is independently hydrogen;

C$_1$-C$_{30}$-alkyl whose carbon chain may be interrupted by one or more —O—, —S—, —NR$^1$—, —N=CR$^1$—, —C≡C—, —CR$^1$=CR$^1$—, —CO—, —SO— and/or —SO$_2$— moieties and which may be mono- or polysubstituted by the (ii), (iii), (iv) and/or (v) radicals specified as substituents for the R radicals;

C$_3$-C$_8$-cycloalkyl to which may be fused further saturated or unsaturated 5- to 7-membered rings whose carbon skeleton may be interrupted by one or more —O—, —S—, —NR$^1$—, —N=CR$^1$—, —CR$^1$=CR$^1$—, —CO—, —SO— and/or —SO$_2$— moieties, where the entire ring system may be substituted by the (i), (ii), (iii), (iv) and/or (v) radicals specified as substituents for the R radicals; or aryl or hetaryl to which may be fused further saturated or unsaturated 5- to 7-membered rings whose carbon skeleton may be interrupted by one or more —O—, —S—, —NR$^1$—, —N=CR$^1$—, —CR$^1$=CR$^1$—, —CO—, —SO— and/or —SO$_2$— moieties, where the entire ring system may be substituted by the (i), (ii), (iii), (iv), (v) radicals specified as substituents for the R radicals, aryl- and/or hetarylazo, each of which may be substituted by C$_1$-C$_{10}$-alkyl, C$_1$-C$_6$-alkoxy and/or cyano;

each R" is independently hydrogen, C$_1$-C$_{30}$-alkyl, C$_5$-C$_8$-cycloalkyl, aryl or hetaryl or are joined together with formation of a 5- to 7-membered ring which comprises the two oxygen atoms and also the boron atom, to which may be fused unsaturated or saturated rings and which may be substituted on the carbon atoms by up to 4 C$_1$-C$_{30}$-alkyl, C$_5$-C$_8$-cycloalkyl, aryl or hetaryl groups;

R$^1$ is hydrogen or C$_1$-C$_{18}$-alkyl, where the R$^1$ radicals may be the same or different when they occur more than once;

R$^2$, R$^3$ are each independently hydrogen;

C$_1$-C$_{18}$-alkyl whose carbon chain may be interrupted by one or more —O—, —S—, —CO—, —SO— and/or —SO$_2$— moieties and which may be mono- or polysubstituted by C$_1$-C$_{12}$-alkoxy, C$_1$-C$_8$-alkylthio, hydroxyl, mercapto, halogen, cyano, nitro and/or —COOR$^1$;

aryl or hetaryl to each of which may be fused further saturated or unsaturated 5- to 7-membered rings whose carbon skeleton may be interrupted by one or more —O—, —S—, —CO— and/or —SO$_2$— moieties, where the entire ring system may be mono- or polysubstituted by C$_1$-C$_{12}$-alkyl and/or the above radicals specified as substituents for alkyl;

and where m, m1, n, n1 fulfill at least one of the following conditions:

m=1, m1=0 and n, n1 are integers whose sum adds up to from 5 to 8;

m=2 and n, n1 are integers whose sum adds up to from 0 to 8, in which case the reaction is effected with (IIIa);

m=1, m1=1 and n, n1 are integers whose sum adds up to from 5 to 12;

m=2, m1=0 and n, n1 are integers whose sum adds up to from 0 to 12;

(b) cyclodehydrogenating the reaction product obtained in step (a) to give a rylene compound of the general formula (I) or (Ia)

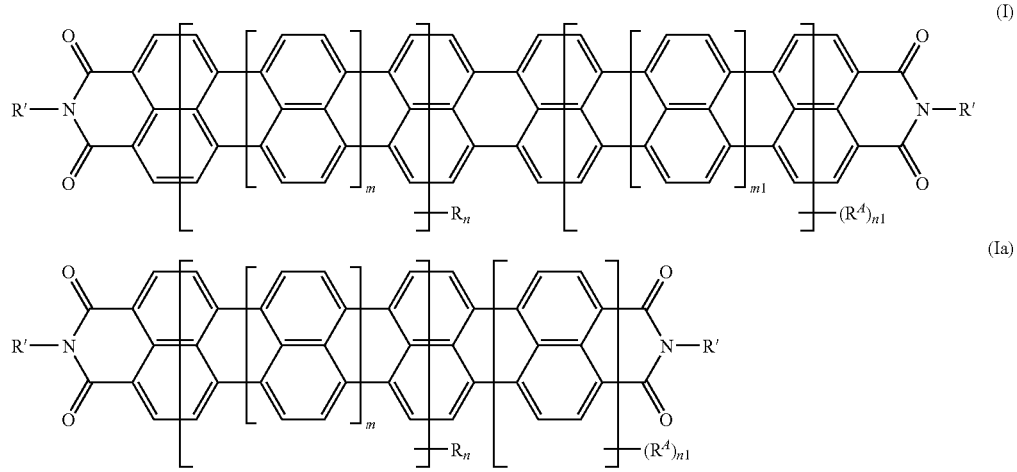

or mixtures thereof.

For the process according to the invention, m, m1, n, n1 fulfill at least one of the following conditions:

To prepare pentarylenetetracarboximides, a corresponding terrylene and a corresponding perylene (m=1, m1=0) are reacted, where n, n1 are integers whose sum adds up to from 5 to 8, i.e. 5, 6, 7 or 8, preferably 5 or 6. Examples of n+n1 are 6+2, 5+3, 4+4, 6+1, 5+2, 4+3, 3+4, 6+0, 5+1, 4+2, 2+4, 3+3, 5+0, 4+1, 1+4, 3+2, 2+3. For n+n1, preference is given to 4+4, 4+2, 2+4, 3+2.

Pentarylenetetracarboximides can also be obtained by employing a corresponding quaterrylene (m=2) in which n, n1 are integers whose sum adds up to from 0 to 8, i.e. 0, 1, 2, 3, 4, 5, 6, 7 or 8, preferably 4, 5 or 6, more preferably 5, 6, 7 or 8, in particular 5 or 6, in which case the reaction is effected with a corresponding naphthalene of the formula (IIIa). Examples of n+n1 are 8+0, 7+0, 6+0, 5+0, 4+0, 3+0, 2+0, 1+0, 0+0, 7+1, 6+1, 5+1, 4+1, 3+1, 2+1, 1+1, 0+1. For n+n1, preference is given to 6+0, 5+0, 4+0, 3+0, 2+0, 6+1, 5+1, 4+1, 3+1, 2+1; greater preference is given to 6+0, 5+0, 4+0, 3+0.

To prepare hexarylenetetracarboximides, two corresponding terrylenes (m=1, m1=1) are reacted, where n, n1 are integers whose sum adds up to from 5 to 12, i.e. 5, 6, 7, 8, 9, 10, 11 or 12, preferably 5, 6, 7 or 8. Examples of n+n1 are 6+6, 6+4, 4+6, 5+5, 6+3, 3+6, 5+4, 4+5, 6+2, 2+6, 5+3, 3+5, 4+4, 6+1, 1+6, 5+2, 2+5, 4+3, 3+4, 6+0, 0+6, 5+1, 1+5, 4+2, 2+4, 3+3, 5+0, 0+5, 4+1, 1+4, 3+2, 2+3. For n+n1 preference is given to 4+4, 4+3, 3+4, 3+3.

Hexarylenetetracarboximides can also be obtained by reacting a corresponding quaterrylene (m=2) and a corresponding perylene (m1=0) where n, n1 are integers whose sum adds up to from 0 to 12, i.e. 0, 1, 2, 3, 4, 5, 6, 7, 8, 9, 10, 11 or 12, preferably 4, 5, 6, 7 or 8, in particular 5, 6, 7 or 8. Examples of n+n1 are 8+0, 7+0, 6+0, 5+0, 4+0, 3+0, 2+0, 1+0, 0+0, 8+1, 7+1, 6+1, 5+1, 4+1, 3+1, 2+1, 1+1, 0+1, 8+2, 7+2, 6+2, 5+2, 4+2, 3+2, 2+2, 1+2, 0+2, 8+3, 7+3, 6+3, 5+3, 4+3, 3+3, 2+3, 1+3, 0+3, 8+4, 7+4, 6+4, 5+4, 4+4, 3+4, 2+4, 1+4, 0+4. For n+n1, preference is given to 6+4, 5+4, 4+4, 3+4, 6+2, 6+0, 5+2, 5+0, 4+2, 4+0, 2+2, 2+0; particular preference is given to 6+4, 4+4, 6+2, 4+2, 6+0, 4+0.

In a particularly preferred embodiment of the process according to the invention for preparing pentarylene and hexarylenetetracarboximides, the reaction is effected with a quaterrylene compound of the general formula (II, m=2).

The present invention therefore further provides a process according to the invention where m=2.

The object is also achieved by pentarylenetetracarboximides of the general formula (I) or mixtures thereof, where n and n1 are integers whose sum adds up to from 5 to 8, i.e. 5, 6, 7 or 8, preferably 5 or 6, and R, $R^A$, R', m, m1 are each as defined above. Examples of n+n1 are 6+2, 5+3, 4+4, 6+1, 5+2, 4+3, 3+4, 6+0, 5+1, 4+2, 2+4, 3+3, 5+0, 4+1, 1+4, 3+2, 2+3. For n+n1 preference is given to 4+4, 4+2, 2+4, 3+2.

The inventive pentarylene compounds can thus be obtained with the aid of the process according to the invention by coupling a corresponding terrylene compound to the corresponding perylene compound. The inventive pentarylene compounds have a high degree of substitution, in which the R and $R^A$ radicals together are present at least five times. However, the sum of the R and $R^A$ substituents is not more than 8.

The object is also achieved by pentarylenetetracarboximides of the general formula (Ia) or mixtures thereof, where n and n1 are integers whose sum adds up to from 5 to 8, i.e. 5, 6, 7 or 8, preferably 5 or 6, and R, $R^A$, R', m are each as defined above. Examples of n+n1 are 8+0, 7+1, 7+0, 6+1, 6+0, 5+1, 5+0, 4+1. For n+n1 preference is given to 6+0, 5+0, 4+0.

The inventive pentarylene compounds can thus be obtained with the aid of the process according to the invention by coupling a corresponding quaterrylene compound to the corresponding naphthalene compound. The inventive pentarylene compounds have a high degree of substitution, in which the R and $R^A$ radicals together are present at least five times. However, the sum of the R and $R^A$ substituents is not more than 8.

The object is also achieved by hexarylenetetracarboximides of the general formula (I) or mixtures thereof, where n and n1 are integers whose sum adds up to from 5 to 12, i.e. 5, 6, 7, 8, 9, 10, 11 or 12, preferably 5, 6, 7 or 8, and R, $R^A$, R', m, m1 are each as defined above. Examples of n+n1 are 8+0, 7+0, 6+0, 5+0, 8+1, 7+1, 6+1, 5+1, 4+1, 8+2, 7+2, 6+2, 5+2, 4+2, 3+2, 8+3, 7+3, 6+3, 5+3, 4+3, 3+3, 2+3, 8+4, 7+4, 6+4, 5+4, 4+4, 3+4, 2+4, 1+4. For n+n1, preference is given to 6+0, 5+0, 6+2, 5+2, 4+2, 6+4, 5+4, 4+4.

The inventive hexarylene compounds can thus be obtained with the aid of the process according to the invention by coupling a corresponding quaterrylene compound to the corresponding perylene compound. The inventive hexarylene compounds have a high degree of substitution, in which the R and $R^A$ radicals together are present at least five times. However, the sum of the R and $R^A$ substituents is not more than 12.

The starting compounds of the formulae (II), (III), (IIIa) are known from the prior art or can be prepared with the aid of literature syntheses of analogous compounds. Especially terrylene and quaterrylene derivatives which can serve as starting materials for the process according to the invention for preparing pentarylene- and hexarylenetetracarboximides, are described in German patent application 10 2005 021362. In addition, the preparation of hexarylene- and pentarylenetetracarboximides is described in DE-A 10 2005 018241. The inventive imide compounds can be prepared analogously.

The process according to the invention for preparing pentarylene- and hexarylenetetracarboximides comprises, as the first step (a), the coupling of at least one terrylene or quaterrylene compound of the formula (II) with at least one compound of the formula (III) or (IIIa), where the two units are linked in each case with the aid of the Y and $Y^1$ groups.

In this case, Y and $Y^1$ may be halides, through which the desired bonding of the two aromatic units is enabled with the aid of a catalytic coupling. It is equally possible that one of the Y, $Y^1$ radicals may be a halide and the other may be a boronic acid or a similar compound of the formula $B(OR")_2$. In that case, coupling is effected via the so-called Suzuki reaction. In both cases, the halides are bromide or chloride.

The inventive diimides are prepared with the aid of the process according to the invention preferably in the presence of an organic solvent, if desired in a mixture with water, and of a transition metal catalyst and of a base, and, as has been stated above, one of the two units may be a boronic acid derivative and the other a halide. Such a boronic acid derivative is obtainable, for example, by reacting the corresponding halogenated aromatic with the aid of diboranes of the general formula (IV) $(R"O)_2B—B(OR")_2$ in the presence of an aprotic organic solvent, of a transition metal catalyst and of a base.

Suitable diboranes of the general formula (IV) are especially bis(1,2- and 1,3-diolato)diboranes, tetraalkoxydiboranes, tetracycloalkoxydiboranes and tetra(het)aryloxydiboranes and their mixed forms. Examples of these compounds include: bis(pinacolato)diborane, bis(1,2-benzodiolato)diborane, bis(2,2-dimethyl-1,3-propanediolato)diborane, bis(1,1,3,3-tetramethyl-1,3-propanediolato)diborane, bis(4,5-pinanediolato)diborane, bis(tetramethoxy)diborane, bis(tetracyclopentoxy)diborane, bis(tetraphenoxy)diborane and bis(4-pyridiyloxy)diborane.

Preference is given to diboranes of the general formula (IV) in which the two R radicals on a boron atom are joined together with formation of a five-membered or six-membered ring which comprises the two oxygen atoms and the boron atom. Aromatic or saturated, including bicyclic, rings having from 5 to 7 carbon atoms as ring members may also be fused to the five- or six-membered rings formed. All rings or ring systems may be substituted by up to 4 $C_1$-$C_{30}$-alkyl, $C_5$-$C_8$-cycloalkyl, aryl and/or hetaryl radicals; they are preferably substituted by up to 4 $C_1$-$C_4$-alkyl radicals. Examples of these preferred diboranes are the bis(1,2- and 1,3-diolato)diboranes already mentioned above, particular preference being given to bis(pinacolato)diborane.

The molar ratio of diborane of the general formula (IV) to the halogenated aromatic is generally from 0.8:1 to 3:1, especially from 1.5:1 to 2:1.

Suitable solvents are in principle all aprotic solvents which are stable toward bases under the reaction conditions and have a boiling point above the selected reaction temperature, in which the reactants dissolve completely at reaction temperature and the catalysts and bases used at least partially, so that substantially homogeneous reaction conditions are present. It is possible to use either nonpolar aprotic or polar aprotic solvents.

Examples of preferred nonpolar aprotic solvents are solvents which boil at >100° C. from the following groups: aliphatics (especially $C_8$-$C_{18}$-alkanes), unsubstituted, alkyl-substituted and fused cycloaliphatics (especially unsubstituted $C_7$-$C_{10}$-cycloalkanes, $C_6$-$C_8$-cycloalkanes which are substituted by from one to three $C_1$-$C_8$-alkyl groups, polycyclic saturated hydrocarbons having from 10 to 18 carbon atoms), alkyl- and cycloalkyl-substituted aromatics (especially benzene which is substituted by from one to three $C_1$-$C_8$-alkyl groups or one $C_5$-$C_8$-cycloalkyl radical) and fused aromatics which may be alkyl-substituted and/or partly hydrogenated (especially naphthalene which is substituted by from one to four $C_1$-$C_8$-alkyl groups) and mixtures of these solvents.

Examples of particularly preferred solvents include: octane, isooctane, nonane, isononane, decane, isodecane, undecane, dodecane, hexadecane and octadecane, cycloheptane, cyclooctane, methylcyclohexane, dimethylcyclohexane, trimethylcyclohexane, ethylcyclohexane, diethylcyclohexane, propylcyclohexane, isopropylcyclohexane, dipropylcyclohexane, butylcyclohexane, tert-butylcyclohexane, methylcycloheptane and methylcyclooctane, toluene, o-, m- and p-xylene, 1,3,5-trimethylbenzene (mesitylene), 1,2,4- and 1,2,3-trimethylbenzene, ethylbenzene, propylbenzene, isopropylbenzene, butylbenzene, isobutylbenzene, tert-butylbenzene and cyclohexylbenzene; naphthalene, decahydronaphthalene (decalin), 1- and 2-methylnaphthalene and 1- and 2-ethylnaphthalene; combinations of the aforementioned solvents, as can be obtained from the high-boiling, partly or fully hydrogenated fractions of thermal and catalytic cracking processes in crude oil or naphtha processing, for example mixtures of the Exsol° type and alkylbenzene mixtures of the Solvesso® type.

Very particularly preferred solvents are xylene (all isomers), mesitylene and in particular toluene.

Examples of suitable polar-aprotic solvents are N,N-disubstituted aliphatic carboxamides (especially N,N-di-$C_1$-$C_4$-alkyl-$C_1$-$C_4$-carboxamides), nitrogen-containing heterocycles and aprotic ethers (especially cyclic ethers, diaryl ethers and di-$C_1$-$C_6$-alkyl ethers of monomeric and oligomeric $C_2$-$C_3$-alkylene glycols which may comprise up to 6 alkylene oxide units, in particular diethylene glycol di-$C_1$-$C_4$-alkyl ethers).

Examples of particularly suitable solvents include: N,N-dimethylformamide, N,N-diethylformamide, N,N-dimethylacetamide and N,N-dimethylbutyramide; N-methyl-2-pyrrolidone, quinoline, isoquinoline, quinaldine, pyrimidine, N-methylpiperidine and pyridine; tetrahydrofuran, dioxane, diphenyl ether, the dimethyl, diethyl, dipropyl, diisopropyl, di-n-butyl, di-sec-butyl and di-tert-butyl ethers of diethylene glycol, diethylene glycol methyl ethyl ether, triethylene glycol dimethyl ether, triethylene glycol diethyl ether and triethylene glycol methyl ethyl ether.

The amount of solvent is generally from 10 to 1000 ml, preferably from 20 to 300 ml, per g of halogenated aromatic.

Suitable transition metal catalysts are in particular palladium complexes, which are in turn generally used in amounts of from 1 to 20 mol %, in particular from 2 to 10 mol %, based on the halogenated aromatic.

Examples of such catalysts are tetrakis(triphenylphosphine)palladium(0), tetrakis(tris-o-tolylphosphine)palladium(0), [1,2-bis(diphenylphosphino)ethane]palladium(II) chloride, [1,1'-bis(diphenylphosphino)ferrocene]palladium(II) chloride, bis(triethylphosphine)-palladium(II) chloride, bis(tricyclohexylphosphine)palladium(II) acetate, (2,2'-bipyridyl)palladium(II) chloride, bis(triphenylphosphine)palladium(II) chloride, tris(dibenzylideneacetone)dipalladium(0), 1,5-cyclooctadienepalladium(II) chloride, bis(acetonitrile)palladium(II) chloride and bis(benzonitrile)palladium(II) chloride, palladium(II) acetate, preference being given to [1,1'-bis(diphenylphosphino)ferrocene]palladium(II) chloride, tetrakis(triphenylphosphine)palladium(0) and palladium(II) acetate.

In general, the simultaneous presence of free ligand molecules is advisable, for example of tri(tert-butyl)phosphine, tri(i-butyl)phosphine, triphenylphosphine and tris(o-tolyl) phosphine, and 2-dicyclohexylphosphino-2,6-dimethoxybiphenyl. Typical amounts are from 80 to 500 mol %, preferably from 100 to 300 mol %, based on the transition metal catalyst.

Useful bases preferably include the alkali metal salts, especially the sodium salts and in particular the potassium salts, weak organic and inorganic acids, such as sodium acetate, potassium acetate, sodium carbonate, sodium hydrogencarbonate, potassium carbonate and potassium hydrogencarbonate, phosphates, fluorides such as potassium fluoride. Preferred bases are the acetates, in particular potassium acetate.

In general, from 1 to 5 mol, preferably from 2 to 4 mol, of base are used per mole of halogenated aromatic.

The reaction temperature is typically from 20 to 180° C., in particular from 60 to 120° C.

The reaction time is generally from 0.5 to 30 h, in particular from 1 to 20 h.

In terms of process technology, the procedure in the preparation of the boronic acid derivatives is appropriately as follows:

The halogenated aromatic and solvent are initially charged, the diborane of the general formula (IV), the transition metal catalyst and the base are added successively and the mixture is heated to the desired reaction temperature under protective gas for from 0.5 to 30 h. After cooling to room temperature, the solid constituents are filtered out of the reaction mixture and the solvent is distilled off under reduced pressure.

The Suzuki reaction of the boronic acid derivative thus prepared with the corresponding halogenated aromatic can in principle be used to prepare the product in step (a) of the process according to the invention under analogous conditions, in which case the corresponding boronic acid derivative instead of the diborane is reacted with the appropriate halogenated aromatic.

However, preference is given to reacting the boronic acid derivative with the halogenated aromatic in the presence of an organic solvent, if desired in a mixture with water, and of a transition metal catalyst and of a base, the molar ratio of boronic acid derivative to halogenated aromatic being generally from 0.8:1 to 3:1, preferably from 0.9:1 to 2:1.

Suitable solvents are all solvents in which the reactants dissolve completely at reaction temperature and the catalysts and bases used at least partially, so that substantially homogeneous reaction conditions are present.

Suitable examples are octane, isooctane, nonane, isononane, decane, isodecane, undecane, dodecane, hexadecane and octadecane, cycloheptane, cyclooctane, methylcyclohexane, dimethylcyclohexane, trimethylcyclohexane, ethylcyclohexane, diethylcyclohexane, propylcyclohexane, isopropylcyclohexane, dipropylcyclohexane, butylcyclohexane, tert-butylcyclohexane, methylcycloheptane and methylcyclooctane, toluene, o-, m- and p-xylene, 1,3,5-trimethylbenzene (mesitylene), 1,2,4- and 1,2,3-trimethylbenzene, ethylbenzene, propylbenzene, isopropylbenzene, butylbenzene, isobutylbenzene, tert-butylbenzene and cyclohexylbenzene; naphthalene, decahydronaphthalene (decalin), 1- and 2-methylnaphthalene and 1- and 2-ethylnaphthalene; combinations of the aforementioned solvents, as can be obtained from the high-boiling, partly or fully hydrogenated fractions of thermal and catalytic cracking processes in crude oil or naphtha processing, for example mixtures of the Exsol® type and alkylbenzene mixtures of the Solvesso® type.

Very particularly preferred solvents are xylene (all isomers), mesitylene and in particular toluene.

The amount of solvent is typically from 10 to 1000 ml, preferably from 20 to 100 ml, per g of boronic acid derivative.

Preference is given to using water as an additional solvent. In this case, generally from 10 to 1000 ml, in particular from 250 to 500 ml, of water are used per l of organic solvent.

The transition metal catalysts used are likewise preferably palladium complexes. The amount of catalyst used is typically from 1 to 20 mol %, in particular from 1.5 to 5 mol %, based on the boronic acid derivative.

In general, the simultaneous presence of free ligand molecules is advisable, for example of tri(tert-butyl)phosphine, tri(i-butyl)phosphine, triphenylphosphine and tris(o-tolyl)phosphine and 2-dicyclohexylphosphino-2,6-dimethoxybiphenyl. Typical amounts are from 80 to 500 mol %, preferably from 100 to 300 mol %, based on the transition metal catalyst.

Preferred bases are alkali metal salts of weak acids, particular preference being given to the carbonates, such as sodium carbonate and in particular potassium carbonate. Preference is likewise also given here to phosphates, such as sodium phosphate or potassium phosphate. In general, the amount of bases is from 0.1 to 10 mol, in particular from 0.2 to 5 mol, per mole of boronic acid derivative.

The reaction temperature is generally from 20 to 180° C., preferably from 60 to 120° C. When water is used in step b), it is advisable not to undertake the reaction at temperatures above 100° C., since it is otherwise necessary to work under pressure.

The reaction has typically ended within from 0.5 to 48 h, in particular within from 5 to 20 h.

In terms of process technology, the procedure is appropriately as follows:

The boronic acid derivative and the halogenated aromatic and solvent are initially charged, transition metal catalyst and the base, preferably dissolved in water or a water/alcohol mixture, are added, and the mixture is heated to the desired reaction temperature under protective gas or from 0.5 to 48 h. After cooling to room temperature, the organic phase is separated from the reaction mixture and the solvent is distilled off under reduced pressure.

The purity of the thus prepared product from step (a) of the process according to the invention for preparing the pentarylene- and hexarylenetetracarboximides is generally sufficient for the further reaction in step (b). If appropriate, the crude product can be purified further by washing with water and, if desired, a suitable organic solvent, especially a chlorinated aliphatic or aromatic hydrocarbon, or by column chromatography on silica gel with a mixture of methylene chloride and hexane or pentane or with toluene as the eluent.

The yield in step a) of the process according to the invention is typically from 20 to 95%.

In addition to the above-described Suzuki reaction, which requires a corresponding boronic acid derivative, a direct coupling, especially in the case of homo couplings, of halides can also be effected.

In this case, the reaction of the correspondingly halogenated aromatics of the formula (II) and (III) or (IIIa) can be effected in the presence of a diborane of the general formula (IV). Finally, a Suzuki reaction likewise proceeds, except that the corresponding boronic acid derivative is generated only in situ.

The coupling can be effected, for example, in the presence of from 30 to 70 mol %, based on the halogenated aromatic, of a diborane of the general formula (IV), of a transition metal catalyst, of a base and of an aprotic solvent by a Suzuki coupling reaction, in which case the boronic acid derivative formed in situ is not intermediately isolated but rather reacted directly with the remaining halogenated aromatic.

In this process variant, the procedure is analogous to the above, except that, for example, only from 30 to 70 mol % of diborane of the general formula (IV), based on the halogenated aromatic, is used.

In general, from 1 to 20 mol %, preferably from 5 to 10 mol %, of transition metal catalyst, and from 1 to 5 mol, preferably from 2 to 3 mol, of base are used per mole of halogenated aromatic. The aprotic organic solvent is used typically in amounts of from 10 to 100 ml, in particular from 20 to 50 ml, per g of halogenated aromatic.

The reaction temperature is generally from 20 to 100° C., preferably from 60 to 80° C., and the reaction time is from 12 to 72 h, preferably from 24 to 48 h.

In terms of process technology, the procedure is appropriately as follows:

The halogenated aromatic and solvent are initially charged, the diborane of the general formula (IV), the transition metal catalyst and the base are added in succession, and the mixture is heated to the desired reaction temperature for from 12 to 72 h. After cooling to room temperature, the organic phase is removed from the reaction mixture and the solvent is distilled off under reduced pressure.

Here too, the purity of the resulting product is generally sufficient for the subsequent cyclodehydrogenation in step (b) of the process according to the invention. Further purification is possible, for example, by column chromatography.

The yield is typically from 80 to 95%.

An additional possibility is to perform a direct coupling of the halogenated aromatics (halogen compound) without using a diborane.

This coupling can be effected, for example, in the presence of an organic transition metal complex as a catalyst, free ligand molecules and an aprotic solvent in a homo coupling.

Suitable inert diluents are, for example, aliphatic carboxamides such as N,N-dimethylformamide and N,N-dimethylacetamide, aliphatic and cycloaliphatic ethers such as 1,2-dimethoxyethane, and aromatics such as benzene, toluene and xylene, preference being given to N,N-dimethylformamide and N,N-dimethylacetamide.

The amount of diluent is generally from 20 to 100 g, preferably from 25 to 45 g, per gram of halogen compound.

Useful organic transition metal complexes which serve as the catalyst include, as well as the known palladium complexes such as tetrakis(triphenylphosphine)palladium(0), especially nickel complexes, for example bis(triphenylphosphine)nickel(II) chloride, tetrakis(triphenylphosphine)nickel (0), [1,2-bis(diphenylphosphino)ethane]nickel(II) chloride and preferably bis(1,5-cyclooctadiene)nickel(0). The catalysts can also be obtained by the addition of transition metal salts or compounds, free ligands such as cyclooctadiene, bipyridyl, triphenylphosphine, trifluorophosphine, η-, δ- and π-bonded olefines, cycloolefines, aromatics and antiaromatics, carbonyls, hydrogen and halogen, and also mixtures thereof, and, if required, oxidising and reducing agents.

In general, from 40 to 150 mol %, preferably from 50 to 100 mol %, of organic transition metal complex based on the halogen compound used are used.

In general, the simultaneous presence of free ligand molecules is always advisable, especially mixtures of cyclooctadiene and bipyridyl in a molar ratio of from 1:1 to 8:1. Suitable amounts here are typically from 80 to 900 mol %, preferably from 80 to 200 mol %, preferably based on the halogen compound.

The coupling temperature is generally from 40 to 80° C., preferably from 60 to 70° C.

The reaction time is generally from 24 to 48 h, in particular from 36 to 48 h.

In terms of process technology, the procedure in this direct coupling is appropriately to initially charge the halogen compound, the organometallic catalyst and free ligand molecules in the inert diluent and, if appropriate under protective gas, to heat to the desired reaction temperature for from 24 to 48 h. After cooling, the reaction mixture is introduced into water which may comprise methanol if appropriate, dilute inorganic acid, for example dilute hydrochloric acid, is added and the precipitate formed is filtered off, washed with water and dried under reduced pressure.

The purity of the inventive product thus produced is generally sufficient for the subsequent cyclodehydrogenation in step (b) of the process according to the invention.

If appropriate, the product may additionally be purified further by column chromatography on silica gel with a mixture of methylene chloride and hexane or pentane as the eluent.

The yield is generally from 70 to 90%.

In step (b) of the process according to the invention, the cyclodehydrogenation of the reaction product obtained in step (a) takes place. The cyclodehydrogenation can be undertaken in an organic reaction medium which has hydroxyl and amino functions and comprises an essentially undissolved base or in the presence of a base-stable high-boiling organic solvent and of an alkali metal or alkaline earth metal base and a nitrogen-containing auxiliary base.

Preference is given to the former process variant. Suitable organic reaction media here are in particular amino alcohols which have from 2 to 20, preferably from 2 to 10 carbon atoms. The carbon chain of these alcohols can be interrupted by oxygen atoms in ether function. Examples of particularly suitable solvents are ethanolamine, triethanolamine and diethanolamine, preference being given to ethanolamine. It is also possible to use mixtures of alcohols and amines which each have a boiling point of at least 70° C. and are liquid at the reaction temperature.

Typically, from 1.5 to 150 ml, preferably from 5 to 50 ml, of reaction medium are used per gram of starting compound.

Suitable bases essentially insoluble in the reaction medium are the alkali metal salts, especially the sodium salts and in particular the potassium salts, weak organic and preferably weak inorganic acids, such as formates, acetates, propionates, hydrogencarbonates and more preferably carbonates, especially sodium carbonate and in particular potassium carbonate.

In general, the amount of base is from 1 to 10 mol, preferably from 2 to 5 mol, per mole of starting compound.

The reaction temperature is generally from 40 to 200° C., in particular from 80 to 160° C.

The reaction time is typically from 0.5 to 64 h, preferably from 1 to 12 h.

In terms of process technology, the procedure is appropriately to stir a mixture of starting compound, solvent and base at the desired reaction temperature under protective gas for from 0.5 to 24 h, and to precipitate the inventive product of the formula (I) or (Ia) formed, after cooling to room temperature, out of the reaction mixture by adding an alcohol, like ethanol, or water, to filter it off and to wash it with water.

The inventive rylene compound can be purified by removing catalyst residues by a rapid filtration through silica gel while washing it with a halogenated aliphatic hydrocarbon such as methylene chloride. Residues of unconverted reactants can be removed by column chromatography on silica gel with methylene chloride as the eluent or by repeated washing with hexane or pentane.

The yield is generally from 90 to 100%.

The product obtained by the process according to the invention for preparing pentarylene- and hexarylenetetracarboximides is diimides of the general formula (I) or (Ia)

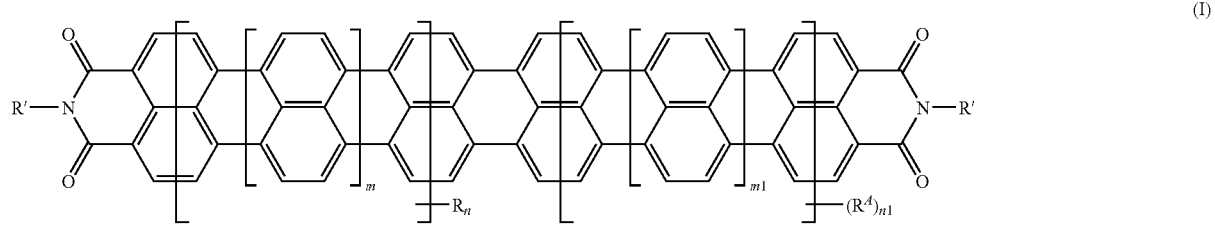

(I)

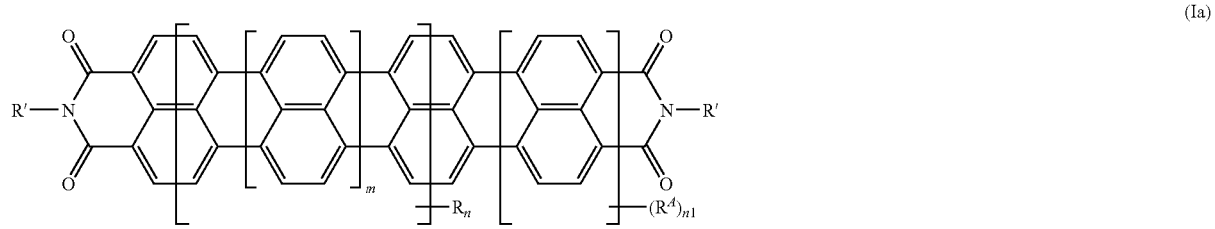

(Ia)

or mixtures thereof.

In this structure, the variables R, $R^4$, R' are each defined as follows:

Each R, $R^4$ are independently identical or different radicals selected from the following:

aryloxy, arylthio, hetaryloxy or hetarylthio, to each of which may be fused further saturated or unsaturated 5- to 7-membered rings whose carbon skeleton may be interrupted by one or more —O—, —S—, —$NR^1$—, —N=$CR^1$—, —CO—, —SO— and/or —$SO_2$— moieties, where the entire ring system may be mono- or polysubstituted by the (i), (ii), (iii), (iv) and/or (v) radicals:

(i) $C_1$-$C_{30}$-alkyl whose carbon chain may be interrupted by one or more —O—, —S—, —$NR^1$—, —N=$CR^1$—, —C≡C—, —$CR^1$=$CR^1$—, —CO—, —SO— and/or —$SO_2$— moieties and which may be mono- or polysubstituted by: $C_1$-$C_{12}$-alkoxy, $C_1$-$C_8$-alkylthio, —C≡$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$, —$POR^2R^3$, aryl and/or saturated or unsaturated $C_4$-$C_7$-cycloalkyl whose carbon skeleton may be interrupted by one or more —O—, —S—, —$NR^1$—, —N=$CR^1$—, —$CR^1$=$CR^1$—, —CO—, —SO— and/or —$SO_2$— moieties, where the aryl and cycloalkyl radicals may each be mono- or polysubstituted by $C_1$-$C_{18}$-alkyl and/or the above radicals specified as substituents for alkyl;

(ii) $C_3$-$C_8$-cycloalkyl whose carbon skeleton may be interrupted by one or more —O—, —S—, —$NR^1$—, —N=$CR^1$—, —$CR^1$=$CR^1$—, —CO—, —SO— and/or —$SO_2$— moieties and to which may be fused further saturated or unsaturated 5- to 7-membered rings whose carbon skeleton may be interrupted by one or more —O—, —S—, —$NR^1$—, —N=$CR^1$—, —$CR^1$=$CR^1$—, —CO—, —SO— and/or —$SO_2$— moieties, where the entire ring system may be mono- or polysubstituted by: $C_1$-$C_{18}$-alkyl, $C_1$-$C_{12}$-alkoxy, $C_1$-$C_6$-alkylthio, —C≡$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$ and/or —$POR^2R^3$;

(iii) aryl or hetaryl to which may be fused further saturated or unsaturated 5- to 7-membered rings whose carbon skeleton may be interrupted by one or more —O—, —S—, —$NR^1$—, —N=$CR^1$—, —$CR^1$=$CR^1$—, —CO—, —SO— and/or —$SO_2$— moieties, where the entire ring system may be mono- or polysubstituted by: $C_1$-$C_{18}$-alkyl, $C_1$-$C_{12}$-alkoxy, $C_1$-$C_8$-alkylthio, —C≡$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$, —$POR^2R^3$, aryl and/or hetaryl, each of which may be substituted by $C_1$-$C_{18}$-alkyl, $C_1$-$C_{12}$-alkoxy, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$—$PR^2R^3$ and/or —$POR^2R^3$;

(iv) a —U-aryl radical which may be mono- or polysubstituted by the above radicals specified as substituents for the aryl radicals (iii), where U is a —O—, —S—, —$NR^1$—, —CO—, —SO— or —$SO_2$— moiety;

(v) $C_1$-$C_{12}$-alkoxy, $C_1$-$C_6$-alkylthio, —C≡$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$ and/or —$POR^2R^3$;

each R' is independently hydrogen;

$C_1$-$C_{30}$-alkyl whose carbon chain may be interrupted by one or more —O—, —S—, —$NR^1$—, —N=$CR^1$—, —C≡C—, —$CR^1$=$CR^1$—, —CO—, —SO— and/or —$SO_2$— moieties and which may be mono- or polysubstituted by the (ii), (iii), (iv) and/or (v) radicals specified as substituents for the R radicals;

$C_3$-$C_8$-cycloalkyl to which may be fused further saturated or unsaturated 5- to 7-membered rings whose carbon skeleton may be interrupted by one or more —O—, —S—, —$NR^1$—, —N=$CR^1$—, —$CR^1$=$CR^1$—, —CO—, —SO— and/or —$SO_2$— moieties, where the entire ring system may be substituted by the (i), (ii), (iii), (iv) and/or (v) radicals specified as substituents for the R radicals; or aryl or hetaryl to which may be fused further saturated or unsaturated 5- to 7-membered rings whose carbon skeleton may be interrupted by one or more —O—, —S—, —$NR^1$—, —N=$CR^1$—, —$CR^1$=$CR^1$—, —CO—, —SO— and/or —$SO_2$— moieties, where the entire ring system may be substituted by the (i), (ii), (iii), (iv), (v) radicals specified as substituents for the R radicals, aryl- and/or hetarylazo, each of which may be substituted by $C_1$-$C_{10}$-alkyl, $C_1$-$C_8$-alkoxy and/or cyano.

In this structure, the variables R", $R^1$ to $R^2$ are each defined as follows:

each R" is independently hydrogen, $C_1$-$C_{30}$-alkyl, $C_5$-$C_8$-cycloalkyl, aryl or hetaryl or joined together with formation of a 5- to –7-membered ring which comprises the two oxygen atoms and also the boron atom, to which may be fused unsaturated or saturated rings and which may be substituted on the carbon atoms by up to 4 $C_1$-$C_{30}$-alkyl, $C_5$-$C_8$-cycloalkyl, aryl or hetaryl groups;

$R^1$ is hydrogen or $C_1$-$C_{18}$-alkyl, where the $R^1$ radicals may be the same or different when they occur more than once;

$R^2$, $R^3$ are each independently hydrogen;

$C_1$-$C_{18}$-alkyl whose carbon chain may be interrupted by one or more —O—, —S—, —CO—, —SO— and/or —$SO_2$— moieties and which may be mono- or polysubstituted by $C_1$-$C_{12}$-alkoxy, $C_1$-$C_6$-alkylthio, hydroxyl, mercapto, halogen, cyano, nitro and/or —$COOR^1$;

aryl or hetaryl to each of which may be fused further saturated or unsaturated 5- to 7-membered rings whose carbon skeleton may be interrupted by one or more —O—, —S—, —CO— and/or —$SO_2$— moieties, where the entire ring system may be mono- or polysubstituted by $C_1$-$C_{12}$-alkyl and/or the above radicals specified as substituents for alkyl.

Specific examples of the R, $R^4$, R', R", $R^1$ to $R^3$ radicals mentioned in the formulae and their substituents include:

Examples of alkyls are methyl, ethyl, propyl, isopropyl, butyl, isobutyl, tert-butyl, pentyl, isopentyl, neopentyl, tert-pentyl, hexyl, 2-methylpentyl, heptyl, 1-ethylpentyl, octyl, 2-ethylhexyl, isooctyl, nonyl, isononyl, decyl, isodecyl, undecyl, dodecyl, tridecyl, isotridecyl, tetradecyl, pentadecyl, hexadecyl, heptadecyl, octadecyl, nonadecyl and eicosyl (the above terms isooctyl, isononyl, isodecyl and isotridecyl are trivial terms and stem from the alcohols obtained by the oxo process). The numbers specified as indices after the symbol "C" refer to the maximum and minimum number of carbon atoms in the alkyls.

Examples of alkyls interrupted by oxygen are 2-methoxyethyl, 2-ethoxyethyl, 2-propoxyethyl, 2-isopropoxyethyl, 2-butoxyethyl, 2- and 3-methoxypropyl, 2- and 3-ethoxypropyl, 2- and 3-propoxypropyl, 2- and 3-butoxypropyl, 2- and 4-methoxybutyl, 2- and 4-ethoxybutyl, 2- and 4-propoxybutyl, 3,6-dioxaheptyl, 3,6-dioxaoctyl, 4,8-dioxanonyl, 3,7-dioxaoctyl, 3,7-dioxanonyl, 4,7-dioxaoctyl, 4,7-dioxanonyl, 2- and 4-butoxybutyl, 4,8-dioxadecyl, 3,6,9-trioxadecyl, 3,6,9-trioxaundecyl, 3,6,9-trioxadodecyl, 3,6,9,12-tetraoxamidecyl and 3,6,9,12-tetraoxatetradecyl.

Examples of alkyls interrupted by sulfur are 2-methylthioethyl, 2-ethylthioethyl, 2-propylthioethyl, 2-isopropylthioethyl, 2-butylthioethyl, 2- and 3-methylthiopropyl, 2- and 3-ethylthiopropyl, 2- and 3-propylthiopropyl, 2- and 3-butylthiopropyl, 2- and 4-methylthiobutyl, 2- and 4-ethylthiobutyl, 2- and 4-propylthiobutyl, 3,6-dithiaheptyl, 3,6-dithiaoctyl, 4,8-dithianonyl, 3,7-dithiaoctyl, 3,7-dithianonyl, 2- and 4-butylthiobutyl, 4,8-dithiadecyl, 3,6,9-trithiadecyl, 3,6,9-trithiaundecyl, 3,6,9-trithiadodecyl, 3,6,9,12-tetrathiamidecyl and 3,6,9,12-tetrathiatetradecyl.

Examples of alkyls interrupted by amino groups are 2-monomethyl- and 2-monoethylaminoethyl, 2-dimethylaminoethyl, 2- and 3-dimethylaminopropyl, 3-monoisopropylaminopropyl, 2- and 4-monopropylaminobutyl, 2- and 4-dimethylaminobutyl, 6-methyl-3,6-diazaheptyl, 3,6-dimethyl-3,6-diazaheptyl, 3,6-di-azaoctyl, 3,6-dimethyl-3,6-diazaoctyl, 9-methyl-3,6,9-triazadecyl, 3,6,9-trimethyl-3,6,9-triazadecyl, 3,6,9-triazaundecyl, 3,6,9-trimethyl-3,6,9-triazaundecyl, 12-methyl-3,6,9,12-tetraazamidecyl and 3,6,9,12-tetramethyl-3,6,9,12-tetraazamidecyl.

Further examples of alkyl groups which are interrupted and/or have substituents are:
(1-ethylethylidene)aminoethylene, (1-ethylethylidene)aminopropylene, (1-ethylethylidene)aminobutylene, (1-ethylethylidene)aminodecylene and (1-ethylethylidene)aminododecylene;
propan-2-on-1-yl, butan-3-on-1-yl, butan-3-on-2-yl and 2-ethylpentan-3-on-1-yl;
2-methylsulfoxidoethyl, 2-ethylsulfoxidoethyl, 2-propylsulfoxidoethyl, 2-isopropylsulfoxidoethyl, 2-butylsulfoxidoethyl, 2- and 3-methylsulfoxidopropyl, 2- and 3-ethylsulfoxidopropyl, 2- and 3-propylsulfoxidopropyl, 2- and 3-butylsulfoxidopropyl, 2- and 4-methylsulfoxidobutyl, 2- and 4-ethylsulfoxidobutyl, 2- and 4-propylsulfoxidobutyl and 4-butylsulfoxidobutyl;
2-methylsulfonylethyl, 2-ethylsulfonylethyl, 2-propylsulfonylethyl, 2-isopropylsulfonylethyl, 2-butylsulfonylethyl, 2- and 3-methylsulfonylpropyl, 2- and 3-ethylsulfonylpropyl, 2- and 3-propylsulfonylpropyl, 2- and 3-butylsulfonylpropyl, 2- and 4-methylsulfonylbutyl, 2- and 4-ethylsulfonylbutyl, 2- and 4-propylsulfonylbutyl and 4-butylsulfonylbutyl;
carboxymethyl, 2-carboxyethyl, 3-carboxypropyl, 4-carboxybutyl, 5-carboxypentyl, 6-carboxyhexyl, 8-carboxyoctyl, 10-carboxydecyl, 12-carboxydodecyl and 14-carboxytetradecyl;
sulfomethyl, 2-sulfoethyl, 3-sulfopropyl, 4-sulfobutyl, 5-sulfopentyl, 6-sulfohexyl, 8-sulfooctyl, 10-sulfodecyl, 12-sulfododecyl and 14-sulfotetradecyl;
2-hydroxyethyl, 2- and 3-hydroxypropyl, 1-hydroxyprop-2-yl, 3- and 4-hydroxybutyl, 1-hydroxybut-2-yl and 8-hydroxy-4-oxaoctyl;
2-cyanoethyl, 3-cyanopropyl, 3- and 4-cyanobutyl, 2-methyl-3-ethyl-3-cyanopropyl, 7-cyano-7-ethylheptyl and 4,7-dimethyl-7-cyanoheptyl;
2-chloroethyl, 2- and 3-chloropropyl, 2-, 3- and 4-chlorobutyl, 2-bromoethyl, 2- and 3-bromopropyl and 2-, 3- and 4-bromobutyl;
2-nitroethyl, 2- and 3-nitropropyl and 2-, 3- and 4-nitrobutyl.

Examples of alkyloxy are methoxy, ethoxy, propoxy, isopropoxy, butoxy, isobutoxy, sec-butoxy, tert-butoxy, pentoxy, isopentoxy, neopentoxy, tert-pentoxy and hexoxy.

Examples of alkylthio are methylthio, ethylthio, propylthio, isopropylthio, butylthio, isobutylthio, sec-butylthio, tert-butylthio, pentylthio, isopentylthio, neopentylthio, tert-pentylthio and hexylthio.

Examples of radicals with a triple bond are ethynyl, 1- and 2-propynyl, 1-, 2- and 3-butynyl, 1-, 2-, 3- and 4-pentynyl, 1-, 2-, 3-, 4- and 5-hexynyl, 1-, 2-, 3-, 4-, 5-, 6-, 7-, 8- and 9-decynyl, 1-, 2-, 3-, 4-, 5-, 6-, 7-, 8-, 9-, 10- and 11-dodecynyl and 1-, 2-, 3-, 4-, 5-, 6-, 7-, 8-, 9-, 10-, 11-, 12-, 13-, 14-, 15-, 16- and 17-octadecynyl.

Examples of radicals with a double bond are ethenyl, 1- and 2-propenyl, 1-, 2- and 3-butenyl, 1-, 2-, 3- and 4-pentenyl, 1-, 2-, 3-, 4- and 5-hexenyl, 1-, 2-, 3-, 4-, 5-, 6-, 7-, 8- and 9-decenyl, 1-, 2-, 3-, 4-, 5-, 6-, 7-, 8-, 9-, 10- and 11-dodecenyl and 1-, 2-, 3-, 4-, 5-, 6-, 7-, 8-, 9-, 10-, 11-, 12-, 13-, 14-, 15-, 16- and 17-octadecenyl.

Examples of further radicals are
methylamino, ethylamino, propylamino, isopropylamino, butylamino, isobutylamino, pentylamino, hexylamino, dimethylamino, methylethylamino, diethylamino, dipropylamino, diisopropylamino, dibutylamino, diisobutylamino, dipentylamino, dihexylamino, dicyclopentylamino, dicyclohexylamino, dicycloheptylamino, diphenylamino and dibenzylamino;
formylamino, acetylamino, propionylamino and benzoylamino;
carbamoyl, methylaminocarbonyl, ethylaminocarbonyl, propylaminocarbonyl, butylaminocarbonyl, pentylaminocarbonyl, hexylaminocarbonyl, heptylaminocarbonyl, octylaminocarbonyl, nonylaminocarbonyl, decylaminocarbonyl and phenylaminocarbonyl;
aminosulfonyl, N,N-dimethylaminosulfonyl, N,N-diethylaminosulfonyl, N-methyl-N-ethylaminosulfonyl, N-methyl-N-dodecylaminosulfonyl, N-dodecylaminosulfonyl, (N,N-dimethylamino)ethylaminosulfonyl, N,N-(propoxyethyl)dodecylaminosulfonyl, N,N-diphenylaminosulfonyl, N,N-(4-tert-butylphenyl)octadecylaminosulfonyl and N,N-bis(4-chlorophenyl)aminosulfonyl;
methoxycarbonyl, ethoxycarbonyl, propoxycarbonyl, isopropoxycarbonyl, hexoxycarbonyl, dodecyloxycarbonyl, octadecyloxycarbonyl, phenoxycarbonyl, (4-tert-butyl-phenoxy)carbonyl and (4-chlorophenoxy)carbonyl;
methoxysulfonyl, ethoxysulfonyl, propoxysulfonyl, isopropoxysulfonyl, butoxysulfonyl, isobutoxysulfonyl, tert-butoxysulfonyl, hexoxysulfonyl, dodecyloxysulfonyl, octadecyloxysulfonyl, phenoxysulfonyl, 1- and 2-naphthyloxysulfonyl, (4-tert-butylphenoxy)sulfonyl and (4-chlorophenoxy)sulfonyl;
diphenylphosphino, di-(o-tolyl)phosphino and diphenylphosphinoxido.

Halogens are chlorine, bromine and iodine.

Aryl- or hetarylazo are, for example, phenylazo, 2-naphthylazo, 2-pyridylazo and 2-pyrimidylazo.

Optionally substituted cycloalkyls are, for example, cyclopropyl, cyclobutyl, cyclopentyl, 2- and 3-methylcyclopentyl, 2- and 3-ethylcyclopentyl, cyclohexyl, 2-, 3- and 4-methylcyclohexyl, 2-, 3- and 4-ethylcyclohexyl, 3- and 4-propylcyclohexyl, 3- and 4-isopropylcyclohexyl, 3- and 4-butylcyclohexyl, 3- and 4-sec-butylcyclohexyl, 3- and 4-tert-butylcyclohexyl, cycloheptyl, 2-, 3- and 4-methylcycloheptyl, 2-, 3- and 4-ethylcycloheptyl, 3- and 4-propylcycloheptyl, 3- and 4-isopropylcycloheptyl, 3- and 4-butylcycloheptyl, 3- and 4-sec-butylcycloheptyl, 3- and 4-tert-butylcycloheptyl, cyclooctyl, 2-, 3-, 4- and 5-methylcyclooctyl, 2-, 3-, 4- and 5-ethylcyclooctyl and 3-, 4- and 5-propylcyclooctyl; 3- and 4-hydroxycyclohexyl, 3- and 4-nitrocyclohexyl and 3- and 4-chlorocyclohexyl. The numbers specified as indices after the symbol "C" refer to the minimum and maximum number of carbon atoms in the alkyls.

Examples of optionally interrupted cycloalkyls are
1-, 2- and 3-cyclopentenyl, 1-, 2-, 3- and 4-cyclohexenyl, 1-, 2- and 3-cycloheptenyl and 1-, 2-, 3- and 4-cyclooctenyl; 2-dioxanyl, 1-morpholinyl, 1-thiomorpholinyl, 2- and 3-tetrahydrofuryl, 1-, 2- and 3-pyrrolidinyl, 1-piperazyl, 1-diketopiperazyl and 1-, 2-, 3- and 4-piperidyl.

Optionally fused and/or substituted and/or interrupted aryl and hetaryl groups should have at least from 3 to 14 ring atoms, preferably from 5 to 10 ring atoms, and are, for example,
phenyl, 2-naphthyl, 2- and 3-pyrryl, 2-, 3- and 4-pyridyl, 2-, 4- and 5-pyrimidyl, 3-, 4- and 5-pyrazolyl, 2-, 4- and 5-imidazolyl, 2-, 4- and 5-thiazolyl, 3-(1,2,4-triazyl), 2-(1,3,5-triazyl), 6-quinaldyl, 3-, 5-, 6- and 8-quinolinyl, 2-benzoxazolyl, 2-benzothiazolyl, 5-benzothiadiazolyl, 2- and 5-benzimidazolyl and 1- and 5-isoquinolyl;
1-, 2-, 3-, 4-, 5-, 6- and 7-indolyl, 1-, 2-, 3-, 4-, 5-, 6- and 7-isoindolyl, 5-(4-methylisoincolyl), 5-(4-phenylisoindolyl), 1-, 2-, 4-, 6-, 7- and 8-(1,2,3,4-tetrahydroisoquinolinyl), 3-(5-phenyl)-(1,2,3,4-tetrahydroisoquinolinyl), 5-(3-dodecyl-(1,2,3,4-tetrahydroisoquinolinyl), 1-, 2-, 3-, 4-, 5-, 6-, 7- and 8-(1,2,3,4-tetrahydroquinolinyl) and 2-, 3-, 4-, 5-, 6-, 7- and 8-chromanyl, 2-, 4- and 7-quinolinyl, 2-(4-phenylquinolinyl) and 2-(5-ethylquinolinyl);
2-, 3- and 4-methylphenyl, 2,4-, 3,5- and 2,6-dimethylphenyl, 2,4,6-trimethylphenyl, 2-, 3- and 4-ethylphenyl, 2,4-, 3,5- and 2,6-diethylphenyl, 2,4,6-triethylphenyl, 2-, 3- and 4-propylphenyl, 2,4-, 3,5- and 2,6-dipropylphenyl, 2,4,6-tripropylphenyl, 2-, 3- and 4-isopropylphenyl, 2,4-, 3,5- and 2,6-diisopropylphenyl, 2,4,6-triisopropylphenyl, 2-, 3- and 4-butylphenyl, 2,4-, 3,5- and 2,6-dibutylphenyl, 2,4,6-tributylphenyl, 2-, 3- and 4-isobutylphenyl, 2,4-, 3,5- and 2,6-diisobutylphenyl, 2,4,6-triisobutylphenyl, 2-, 3- and 4-sec-butylphenyl, 2,4-, 3,5- and 2,6-di-sec-butylphenyl and 2,4,6-tri-sec-butylphenyl; 2-, 3- and 4-methoxyphenyl, 2,4-, 3,5- and 2,6-dimethoxyphenyl, 2,4,6-trimethoxyphenyl, 2-, 3- and 4-ethoxyphenyl, 2,4-, 3,5- and 2,6-diethoxyphenyl, 2,4,6-triethoxyphenyl, 2-, 3- and 4-propoxyphenyl, 2,4-, 3,5- and 2,6-dipropoxyphenyl, 2-, 3- and 4-isopropoxyphenyl, 2,4- and 2,6-diisopropoxyphenyl and 2-, 3- and 4-butoxyphenyl; 2-, 3- and 4-chlorophenyl and 2,4-, 3,5- and 2,6-dichlorophenyl; 2-, 3- and 4-hydroxyphenyl and 2,4-, 3,5- and 2,6-dihydroxyphenyl; 2-, 3- and 4-cyanophenyl; 3- and 4-carboxyphenyl; 3- and 4-carboxamidophenyl, 3- and 4-N-methylcarboxamidophenyl and 3- and 4-N-ethylcarboxamidophenyl; 3- and 4-acetylaminophenyl, 3- and 4-propionylaminophenyl and 3- and 4-butyrylaminophenyl; 3- and 4-N-phenylaminophenyl, 3- and 4-N-(o-tolyl)aminophenyl, 3- and 4-N-(m-tolyl)aminophenyl and 3- and 4-N-(p-tolyl)aminophenyl; 3- and 4-(2-pyridyl)aminophenyl, 3- and 4-(3-pyridyl)aminophenyl, 3- and 4-(4-pyridyl)aminophenyl, 3- and 4-(2-pyrimidyl)aminophenyl and 4-(4-pyrimidyl)aminophenyl;
4-phenylazophenyl, 4-(1-naphthylazo)phenyl, 4-(2-naphthylazo)phenyl, 4-(4-naphthylazo)phenyl, 4-(2-pyridylazo)phenyl, 4-(3-pyridylazo)phenyl, 4-(4-pyridylazo)phenyl, 4-(2-pyrimidylazo)phenyl, 4-(4-pyrimidylazo)phenyl and 4-(5-pyrimidylazo)phenyl;
phenoxy, phenylthio, 2-naphthoxy, 2-naphthylthio, 2-, 3- and 4-pyridyloxy, 2-, 3- and 4-pyridylthio, 2-, 4- and 5-pyrimidyloxy and 2-, 4- and 5-pyrimidylthio.

The inventive diimides of the general formulae (I) and (Ia) or mixtures thereof are preferably those in which R and $R^4$ are the same.

The inventive diimides of the general formulae (I) and (Ia) or mixtures thereof are likewise preferably those in which R, $R^4$ are each independently aryloxy or arylthio, where the entire ring system may be mono- or polysubstituted by the (i), (ii), (iii), (iv) and/or (v) radicals as specified above. It is especially preferred when R, $R^4$ may each independently be mono- or polysubstituted by a (i) radical.

The inventive diimides of the general formulae (I) and (Ia) or mixtures thereof are likewise preferably those in which R, $R^4$ are each independently

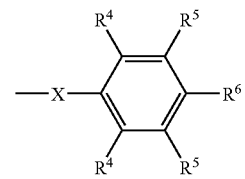

where
X is O or S and
$R^4$, $R^5$, $R^6$ may each independently be hydrogen or the (i), (ii), (iii), (iv) and/or (v) radicals as specified above, with the proviso that at least one of the $R^4$, $R^6$ radicals is not hydrogen. It is especially preferred that when $R^4$ is $C_1$-$C_{30}$-alkyl or $C_3$-$C_8$-cycloalkyl, a ternary carbon atom does not occur in the 1-position.

It is also preferred that neither $R^4$ is hydrogen and $R^5$, $R^6$ are each hydrogen, or $R^6$ is not hydrogen and $R^4$, $R^5$ are each hydrogen.

The inventive diimides of the general formulae (I) and (Ia) or mixtures thereof are likewise preferably those in which each R' is independently $C_1$-$C_{30}$-alkyl or aryl, where the entire ring system may be mono- or polysubstituted by the (i), (ii), (iii), (iv) and/or (v) radicals as specified above. Especially preferably, R' is mono- or polysubstituted by a (i) radical. Likewise preferably, all R' are identical.

The inventive diimides of the general formula (I) and (Ia) exhibit strong absorption in the infrared region at wavelengths of from 700 to 1100 nm. Their functionalization can be selected in a controlled manner, such that they can be adjusted directly to the desired end use.

They are suitable for a multitude of uses, such as coloring high molecular weight organic and inorganic materials, for example of coatings, printing inks and plastics, for preparing aqueous polymer dispersions which absorb in the near infrared region of the electromagnetic spectrum, for obtaining markings and inscriptions which absorb infrared light and are invisible to the human eye, as infrared absorbers for heat management, as IR laser beam-absorbing materials in the fusion treatment of plastics parts, as semiconductors in organic electronics, as emitters in electro- and chemiluminescence applications, or as active components in photovoltaics.

EXAMPLES

Example 1

Preparation of N-(2,6-diisopropylphenyl-1,6,11,15-tetra[4-(1,1,3,3-tetramethylbutyl)-phenoxy]-13-(4-[N-(2,6-diisopropylphenyl)]naphthalene-1,8-dicarboximide)quaterrylene-3,4-dicarboximide First a solution of 0.042 g (0.3 mmol) of potassium carbonate in 2 ml of water and then 0.01 g (0.004 mmol) of palladium(II) acetate and 0.36 g (0.009 mmol) of 2-dicyclohexylphosphino-2,6-dimethoxybiphenyl were added to a mixture, stirred under $N_2$, of 0.028 g (0.058 mmol) of N-(2,6-diisopropylphenyl-4-(4,4,5,5-tetramethyl-1,3,2-dioxaboran-2-yl)naphthalene-1,8-dicarboximide and 0.07 g (0.044 mmol) of N-(2,6-diisopropylphenyl-1,6,11,15-tetra[4-(1,1,3,3-tetramethylbutyl)phenoxy]-13-chloroquaterrylene-3,4-dicarboximide in 15 ml of toluene. The mixture was heated to 85° C. under $N_2$ and stirred at this temperature for 24 h. After cooling to room temperature, the organic phase was removed and the solvent was drawn off under reduced pressure. The crude product was subjected to column chromatography on silica gel with a 1:1 mixture of methylene chloride and hexane as the eluent.

25 mg product were obtained in the form of a green solid, which corresponds to a yield of 31%.

Analytical Data:
UV-Vis ($CHCl_3$): $\lambda_{max}$=759 nm;
MS (Maldi): m/z (rel. int.)=1900.9 (100%) [M+].

Example 2

Cyclodehydrogenation to give N,N'-bis(2,6-diisopropylphenyl)-1,6,11,20-tetra[4-(1,1,3,3-tetramethylbutyl)phenoxy]pentarylene-3,4:15,16-tetracarboximide A mixture of 0.05 g (0.03 mmol) of the product of example 1, 0.12 g (0.86 mmol) of potassium carbonate and 2.0 ml of ethanolamine and 1.0 ml of diethylene glycol diethyl ether was heated to 120° C. under a nitrogen atmosphere. After 24 h, a large amount of reactant was still observed by means of TLC. After 64 h, the reactant had reacted completely.

After cooling, the reaction product was precipitated in water, filtered off, and washed with hot water and finally with hexane until the effluent became colorless. The residue was subjected to an overnight Soxlet extraction with hexane. The product was dried at 70° C. under reduced pressure.

0.03 g product were obtained in the form of a black-green solid, which corresponds to a yield of 60%.

Analytical Data:
UV-Vis ($CHCl_3$): $\lambda_{max}$=863, 777 nm;
MS (Maldi): m/z (rel. int.)=1899.2 (100%) [M+].

Example 3

Preparation of N-(2,6-diisopropylphenyl-1,6,8,11,15,(17)18-hexa[4-(1,1,3,3-tetramethylbutyl)phenoxy]-13-(4-[N-(2,6-diisopropylphenyl)]naphthalene-1,8-dicarboximide)-quaterrylene-3,4-dicarboximide First a solution of 0.042 g (0.3 mmol) of potassium carbonate in 2 ml of water and then 0.01 g (0.004 mmol) of palladium(II) acetate and 0.36 g (0.009 mmol) of 2-dicyclohexylphosphino-2,6-dimethoxybiphenyl were added to a mixture, stirred under $N_2$, of 0.03 g (0.06 mmol) of N-(2,6-diisopropylphenyl-4-(4,4,5,5-tetramethyl-1,3,2-dioxaboran-2-yl)naphthalene-1,8-dicarboximide and 0.10 g (0.052 mmol) of N-(2,6-diisopropylphenyl-1,6,8,11,15,(17)18-penta[4-(1,1,3,3-tetramethylbutyl)phenoxy]-13-chloroquaterrylene-3,4-dicarboximide in 15 ml of toluene. The mixture was heated to 85° C. under N2 and stirred at this temperature for 24 h. After cooling to room temperature, the organic phase was removed and the solvent was drawn off under reduced pressure. The crude product was subjected to column chromatography on silica gel with a 1:1 mixture of methylene chloride and hexane as the eluent.

25 mg product were obtained in the form of a green solid, which corresponds to a yield of 21%.

Analytical Data:
UV-Vis ($CH_2Cl_2$): $\lambda_{max}$=760 nm;
MS (Maldi): m/z (rel. int.)=2310.9 (100%) [M+].

Example 4

Cyclodehydrogenation to give N,N'-bis(2,6-diisopropylphenyl)-1,6,8,11,20,(22)23-hexa[4-(1,1,3,3-tetramethylbutyl)phenoxy]pentarylene-3,4:15,16-tetracarboximide A mixture of 0.05 g (0.038 mmol) of product of example 3, 0.12 g (0.86 mmol) of potassium carbonate and 2.0 ml of ethanolamine and 1.0 ml of diethylene glycol diethyl ether was heated to 120° C. under a nitrogen atmosphere. After 24 h, a large amount of reactant was still observed by means of TLC. After 64 h, the reactant had been converted completely.

After cooling, the reaction product was precipitated in water, filtered off and washed with hot water and finally with hexane until the effluent became colorless. The residue was subjected to an overnight Soxlet extraction with hexane. The product was dried at 70° C. under reduced pressure.

0.027 g product was obtained in the form of a black-green solid, which corresponds to a yield of 55%.

UV-Vis ($CH_2Cl_2$): $\lambda_{max}$=865, 779 nm;
MS (Maldi): m/z (rel. int.)=2309.1 (100%) [M+].

Example 5

Preparation of N-(2,6-diisopropylphenyl-1,6,11,15-tetra[4-(1,1,3,3-tetramethylbutyl)-phenoxy]-13-(9-[N-(2,6-diisopropylphenyl)]-1,6-bis[4-(1,1,3,3-tetramethylbutyl)-phenoxy]perylene-3,4-dicarboximide)quaterrylene-3,4-dicarboximide First a solution of 0.042 g (0.3 mmol) of potassium carbonate in 2 ml of water and then 0.01 g (0.004 mmol) of palladium(II) acetate and 0.36 g (0.009 mmol) of 2-dicyclohexylphosphino-2,6-dimethoxybiphenyl were added to a mixture, stirred under $N_2$, of 0.059 g (0.058 mmol) of N-(2,6-diisopropylphenyl-1,6-bis[4-(1,1,3,3-tetramethylbutyl)phenoxy]-9-(4,4,5,5-tetramethyl-1,3,2-dioxaboran-2-yl)perylene-3,4-dicarboximide and 0.07 g (0.044 mmol) of N-(2,6-diisopropylphenyl-1,6,11,15-tetra[4-(1,1,3,3-tetramethylbutyl)phenoxy]-13-chloroquaterrylene-3,4-dicarboximide in 15 ml of toluene. The mixture was heated to 85° C. under $N_2$ and stirred at this temperature for 24 h. After cooling to room temperature, the organic phase was removed and the solvent was drawn off under reduced pressure. The crude product was subjected to column chromatography on silica gel with a 1:1 mixture of methylene chloride and hexane as the eluent.

30 mg product were obtained in the form of a black-green solid, which corresponds to a yield of 28%.

Analytical Data:
UV-Vis ($CH_2Cl_2$): $\lambda_{max}$=757, 528 nm;
MS (Maldi): m/z (rel. int.)=2433.2 (100%) [M+].

Example 6

Cyclodehydrogenation to give N,N'-bis(2,6-diisopropylphenyl)-1,6,10,15,20,25-hexa[4-(1,1,3,3-tetramethylbutyl)phenoxy]hexarylene-3,4:17,18-tetracarboximide A mixture of 0.05 g (0.03 mmol) of product of example 5, 0.12 g (0.86 mmol) of potassium carbonate and 2.0 ml of ethanolamine and 1.0 ml were heated to 120° C. under a nitrogen atmosphere. After 24 h, a large amount of reactant was still observed by means of TLC. After 64 h, reactant had been converted completely.

After cooling, the reaction product was precipitated in water, filtered off, and washed with hot water and finally with hexane until the effluent became colorless. The residue was subjected to an overnight Soxlet extraction with hexane. The product was dried at 70° C. under reduced pressure.

0.031 g product was obtained in the form of a blue-green solid, which corresponds to a yield of 60%.

Analytical Data:
UV-Vis (CH$_2$Cl$_2$): $\lambda_{max}$=942, 841 nm;
MS (Maldi): m/z (rel. int.)=2431.5 (100%) [M+].
IR (KBr): ν (cm$^{-1}$)=2958, 2360, 2342, 1703, 1668, 1589, 1567, 1537, 1503, 1472, 1409, 1364, 1320, 1279, 1211, 1179, 1105, 1056, 875, 837.

Example 7

Preparation of N-(2,6-diisopropylphenyl-1,6,9,14-tetra[2,6-diisopropylphenoxy]-11-(11-[N-(2,6-diisopropylphenyl)]-1,6-bis[2,6-diisopropylphenoxy]terrylene-3,4-dicarboximide)terrylene-3,4-dicarboximide A mixture of 0.47 g (0.33 mol) of N-(2,6-diisopropylphenyl-1,6,9,14-tetra(2,6-diisopropylphenoxy)-11-(4,4,5,5-tetramethyl-1,3,2-dioxaboran-2-yl)-terrylene-3,4-dicarboximide, 0.41 g (0.30 mmol) of N-(2,6-diisopropylphenyl-1,6,9,14-tetra(2,6-diisopropylphenoxy)-11-bromoterrylene-3,4-dicarboximide and 25 ml of toluene were stirred at room temperature under N2. After 10 min, 0.035 g (0.030 mmol) of Pd(PPh$_3$)$_4$ and 0.3 g of potassium carbonate in 5.5 ml of water and ethanol (10:1) were added. The mixture was then heated to 85° C. under N2 and stirred at this temperature for 72 h.

The cooled reaction mixture was subjected to column chromatography on silica gel with CHCl$_3$: ethyl acetate (19:1).

0.43 g product was obtained, which corresponds to a yield of 53%.

Analytical Data:
$^1$H NMR: (500 MHz, CD$_2$Cl$_2$, 25° C.): δ=9.8 (d, 4H), 9.5 (d, 4H), 7.85 (s, 4H), 7.8-7.1 (m, 36H), 3.15 (m, 16H), 2.6 (m, 4H), 1.4-0.9 (m 120H)
UV-Vis (CHCl$_3$): $\lambda_{max}$ (ε)=698 (163 000) (M$^{-1}$ cm$^{-1}$);
MS (Maldi): m/z (rel. int.)=2617.3 (100%) [M+].

Example 8

Cyclodehydrogenation to give N,N'-bis(2,6-diisopropylphenyl)-1,6,9,12,15,20,23,26-octa(2,6-diisopropylphenylphenoxy)hexarylene-3,4:17,18-tetracarboximide A mixture of 0.210 g (0.080 mmol) of product of example 7, 0.610 g (4.4 mmol) of potassium carbonate and 10 ml of ethanolamine was heated to 120° C. under a nitrogen atmosphere. After 24 h, a large amount of reactant was still observed by means of TLC. After 64 h, reactant had been converted completely.

After cooling, the reaction product was precipitated in water, filtered off, and washed with hot water and finally with hexane until the effluent became colorless. The product was dried at 70° C. under reduced pressure.

0.131 g product was obtained in the form of a green solid, which corresponds to a yield of 63%.

Analytical Data:
UV-Vis (CHCl$_3$): $\lambda_{max}$=973, 862 nm;
MS (Maldi): m/z (rel. int.)=2615.5 (100%) [M+].

The invention claimed is:
1. A process for preparing at least one of a pentarylene- and hexarylenetetracarboximide, comprising
(a) coupling at least one terrylene or quaterrylene compound of the formula (II)

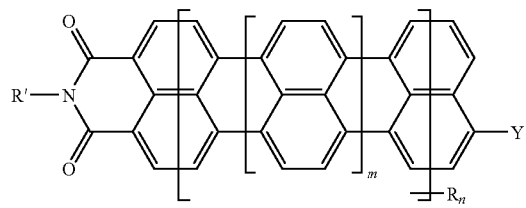

with at least one compound of the formula (III) or (IIIa)

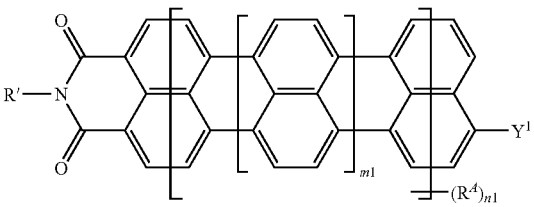

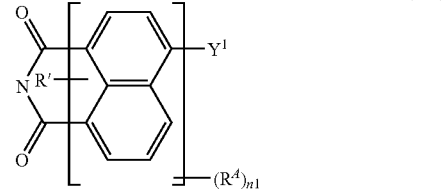

wherein
Y, Y$^1$ are each halogen, or one radical of Y, Y$^1$ is halogen and the other is B(OR")$_2$;
each R and R$^A$ are independently identical or different radicals selected from the following:
aryloxy, arylthio, hetaryloxy or hetarylthio, to each of which are optionally fused further saturated or unsaturated 5- to 7-membered rings whose carbon skeleton may be interrupted by one or more —O—, —S—, —NR$^1$—, —N═CR$^1$—, —CO—, —SO— and/or —SO$_2$— moieties, wherein the entire ring system is optionally mono- or polysubstituted by at least one radical selected from the group consisting of (i), (ii), (iii), (iv), and (v):
(i) C$_1$-C$_{30}$-alkyl whose carbon chain is optionally interrupted by one or more —O—, —S—, —NR$^1$—, —N═CR$^1$—, —C═C—, —CR$^1$═CR$^1$—, —CO—, —SO— and/or —SO$_2$— moieties and which are optionally mono- or polysubstituted by: C$_1$-C$_{12}$-alkoxy, C$_1$-C$_6$-alkylthio, —C═CR$^1$, —CR$^1$═CR$^1$$_2$, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$, —SO$_3$R$^2$, —PR$^2$R$^3$, —POR$^2$R$^3$, aryl and/or saturated or unsaturated C$_4$-C$_7$-cycloalkyl whose carbon skeleton is optionally interrupted by one or more —O—, —S—, —NR$^1$—, —N=CR$^1$—, —CR$^1$=CR$^1$—, —CO—, —SO— and/or —SO$_2$— moieties, where the aryl and cycloalkyl radicals are optionally each mono- or polysubstituted by C$_1$-C$_{18}$-alkyl and/or the above radicals specified as substituents for alkyl;

(ii) C$_3$-C$_8$-cycloalkyl whose carbon skeleton is optionally interrupted by one or more —O—, —S—, —NR$^1$—, —N=CR$^1$—, —CR$^1$=CR$^1$—, —CO—, —SO— and/or —SO$_2$— moieties and to which are optionally fused further saturated or unsaturated 5- to 7-membered rings whose carbon skeleton is optionally interrupted by one or more —O—, —S—, —NR$^1$—, —N=CR$^1$—, —CR$^1$=CR$^1$—, —CO—, —SO— and/or —SO$_2$— moieties, where the entire ring system may be mono- or polysubstituted by: C$_1$-C$_{18}$-alkyl, C$_1$-C$_{12}$-alkoxy, C$_1$-C$_6$-alkylthio, —C=CR$^1$, —CR$^1$=CR$^1$$_2$, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$, —SO$_3$R$^2$, —PR$^2$R$^3$ and/or —POR$^2$R$^3$;

(iii) aryl or hetaryl to which is optionally fused at least one further saturated or unsaturated 5- to 7-membered ring whose carbon skeleton is optionally interrupted by one or more —O—, —S—, —NR$^1$—, —N=CR$^1$—, —CR$^1$=CR$^1$—, —CO—, —SO— and/or —SO$_2$— moieties, where the entire ring system is optionally mono- or polysubstituted by: C$_1$-C$_{18}$-alkyl, C$_1$-C$_{12}$-alkoxy, C$_1$-C$_6$-alkylthio, —C=CR$^1$, —CR$^1$=CR$^1$$_2$, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$, —SO$_3$R$^2$, —PR$^2$R$^3$, —POR$^2$R$^3$, aryl and/or hetaryl, each of which is optionally substituted by C$_1$-C$_{18}$-alkyl, C$_1$-C$_{12}$-alkoxy, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$, —SO$_3$R$^2$, —PR$^2$R$^3$ and/or —POR$^2$R$^3$;

(iv) a —U-aryl radical which is optionally mono- or polysubstituted by the above radicals specified as substituents for the aryl radicals (iii), where U is a —O—, —S—, —NR$^1$—, —CO—, —SO— or —SO$_2$— moiety; and (v) C$_1$-C$_{12}$-alkoxy, C$_1$-C$_6$-alkylthio, —C=CR$^1$, —CR$^1$=CR$^1$$_2$, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$, —SO$_3$R$^2$, —PR$^2$R$^3$ and/or —POR$^2$R$^3$;

each R' is independently hydrogen;

C$_1$-C$_{30}$-alkyl whose carbon chain is optionally interrupted by one or more —O—, —S—, —NR$^1$—, —N=CR$^1$—, —C=C—, —CR$^1$=CR$^1$—, —CO—, —SO— and/or —SO$_2$— moieties and which are optionally mono- or polysubstituted by the (ii), (iii), (iv) and/or (v) radicals specified as substituents for the R radicals;

C$_3$-C$_8$-cycloalkyl to which is optionally fused further saturated or unsaturated 5- to 7-membered rings whose carbon skeleton is optionally interrupted by one or more —O—, —S—, —NR$^1$—, —N=CR$^1$—, —CR$^1$=CR$^1$—, —CO—, —SO— and/or —SO$_2$— moieties, where the entire ring system is optionally substituted by the (i), (ii), (iii), (iv) and/or (v) radicals specified as substituents for the R radicals; or aryl or hetaryl to which is optionally fused further saturated or unsaturated 5- to 7-membered rings whose carbon skeleton is optionally interrupted by one or more —O—, —S—, —NR$^1$—, —N=CR$^1$—, —CR$^1$=CR$^1$—, —CO—, —SO— and/or —SO$_2$— moieties, where the entire ring system is optionally substituted by the (i), (ii), (iii), (iv), (v) radicals specified as substituents for the R radicals, aryl- and/or hetarylazo, each of which is optionally substituted by C$_1$-C$_{10}$-alkyl, C$_1$-C$_6$-alkoxy and/or cyano;

each R" is independently hydrogen, C$_1$-C$_{30}$-alkyl, C$_5$-C$_8$-cycloalkyl, aryl or hetaryl or are joined together with formation of a 5- to 7-membered ring which comprises the two oxygen atoms and also the boron atom, to which is optionally fused at least one unsaturated or saturated ring and which is optionally substituted on the carbon atoms by up to 4 C$_1$-C$_{30}$-alkyl, C$_5$-C$_8$-cycloalkyl, aryl or hetaryl groups;

R$^1$ is hydrogen or C$_1$-C$_{18}$-alkyl, where the R$^1$ radicals are the same or different when they occur more than once;

R$^2$, R$^3$ are each independently hydrogen;

C$_1$-C$_{18}$-alkyl whose carbon chain is optionally interrupted by one or more —O—, —S—, —CO—, —SO— and/or —SO$_2$— moieties and which is optionally mono- or polysubstituted by C$_1$-C$_{12}$-alkoxy, C$_1$-C$_6$-alkylthio, hydroxyl, mercapto, halogen, cyano, nitro and/or —COOR$^1$;

aryl or hetaryl to each of which is optionally fused at least one further saturated or unsaturated 5- to 7-membered ring whose carbon skeleton may be interrupted by one or more —O—, —S—, —CO— and/or —SO$_2$— moieties, where the entire ring system may be mono- or polysubstituted by C$_1$-C$_{12}$-alkyl and/or the above radicals specified as substituents for alkyl;

and where m, m1, n, n1 fulfill at least one of the following conditions:

m=1, m1=0 and n, n1 are integers whose sum adds up to from 5 to 8;

m=2 and n, n1 are integers whose sum adds up to from 5 to 8, in which case the reaction is effected with (IIIa);

m=1, m1=1 and n, n1 are integers whose sum adds up to from 5 to 12;

m=2, m1=0 and n, n1 are integers whose sum adds up to from 5 to 8; and (b) cyclodehydrogenating the reaction product obtained in (a) to give a rylene compound of the general formula (I) or (Ia)

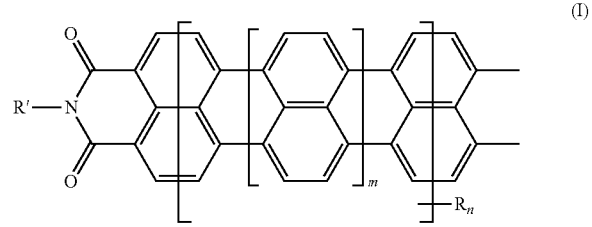

(I)

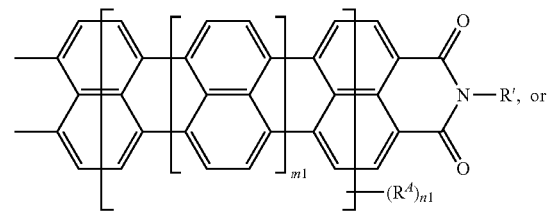

, or or mixtures thereof.

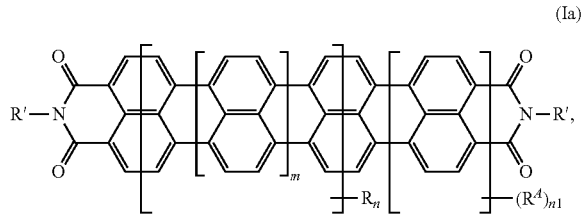

2. The process of claim 1, wherein, in the reaction product obtained in (a), m=2.

3. The process of claim 1, wherein the reaction product obtained in (a) is a pentarylenetetracarboximide of formula (I) or at least one mixture thereof, wherein n and n1 are integers whose sum adds up to from 5 to 8.

4. The process of claim 1, wherein the reaction product obtained in (a) is a pentarylenetetracarboximide of formula (Ia) or at least one mixture thereof, wherein n and n1 are integers whose sum adds up to from 5 to 8.

5. The process of claim 1, wherein the reaction product obtained in (a) is a hexarylenetetracarboximide of formula (I) or at least one mixture thereof, wherein n and n1 are integers whose sum adds up to from 5 to 12.

6. The process of claim 1, wherein the reaction product obtained in (a) is a diimide or at least one mixture thereof, wherein R and $R^A$ are the same.

7. The process of claim 1, wherein the reaction product obtained in (a) is a diimide or at least one mixture thereof, wherein R and $R^A$ are each independently aryloxy or arylthio, where the entire ring system is optionally mono- or polysubstituted by the at least one radical selected from the group consisting of (i), (ii), (iii), (iv), and (v).

8. The process of claim 1, wherein the reaction product obtained in (a) is a diimide or at least one mixture thereof, wherein R and $R^A$ are optionally each independently mono- or polysubstituted by a (i) radical.

9. The process of claim 1, wherein the reaction product obtained in (a) is a diimide or at least one mixture thereof, wherein R and $R^A$ are each independently

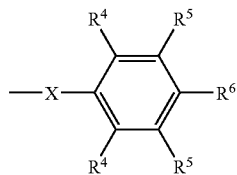

wherein

X is O or S, and $R^4$, $R^5$, and $R^6$ are optionally each independently hydrogen or the at least one radical selected from the group consisting of (i), (ii), (iii), (iv), and (v), with the proviso that at least one of the $R^4$ and $R^6$ radicals is not hydrogen.

10. The process of claim 9, wherein, in the diimide or mixture, either $R^4$ is hydrogen and $R^5$ and $R^6$ are each hydrogen, or $R^6$ is not hydrogen and $R^4$ and $R^5$ are each hydrogen.

11. The process of claim 1, wherein, in the diimide or mixture, each R' is independently $C_1$-$C_{30}$-alkyl or aryl, and wherein the entire ring system is optionally mono- or polysubstituted by the at least one radical selected from the group consisting of (i), (ii), (iii), (iv), and (v).

12. The process of claim 1, wherein, in the diimide or mixture, R' is mono- or polysubstituted by a (i) radical.

13. A high molecular weight organic material, a high molecular weight inorganic material, an organic pigment, a polymer dispersion which absorbs in the near infrared region of the electromagnetic spectrum, a marking or inscription which absorbs infrared light and is invisible to the human eye, an infrared absorber, an IR laser beam-absorbing material, a semiconductor in organic electronics, an emitter in a electro- or chemiluminescence application, or an active component in photovoltaics, comprising a tetracarboximide or at least one mixture thereof produced by the process of claim 1.

14. A pentarylene- or hexarylenetetracarboximide of formula (I) or at least one mixture thereof,

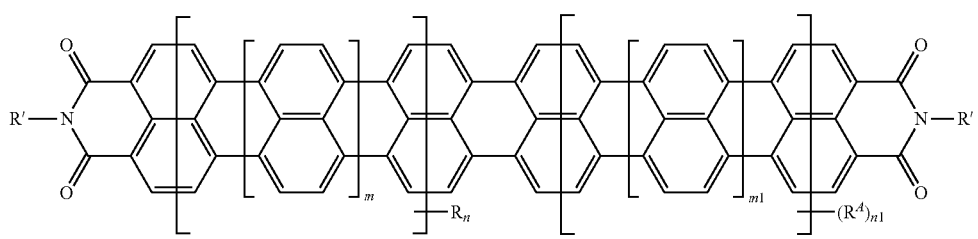

wherein each R and $R^A$ are independently identical or different radicals selected from the following:

aryloxy, arylthio, hetaryloxy or hetarylthio, to each of which are optionally fused further saturated or unsaturated 5- to 7-membered rings whose carbon skeleton may be interrupted by one or more —O—, —S—, —$NR^1$—, —N=$CR^1$—, —CO—, —SO— and/or —$SO_2$— moieties, wherein the entire ring system is optionally mono- or polysubstituted by at least one radical selected from the group consisting of (i), (ii), (iii), (iv), and (v):

(i) $C_1$-$C_{30}$-alkyl whose carbon chain is optionally interrupted by one or more —O—, —S—, —$NR^1$—, —N=$CR^1$—, —C=C—, —$CR^1$=$CR^1$—, —CO—, —SO— and/or —$SO_2$— moieties and which are optionally mono- or polysubstituted by: $C_1$-$C_{12}$-alkoxy, $C_1$-$C_6$-alkylthio, —C=$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$, —$POR^2R^3$, aryl and/or saturated or unsaturated $C_4$-$C_7$-cycloalkyl whose carbon skeleton is optionally interrupted by one or more —O—, —S—, —NR$^1$—, —N═CR$^1$—, —CR$^1$═CR$^1$—, —CO—, —SO— and/or —SO$_2$— moieties, where the aryl and cycloalkyl radicals are optionally each mono- or polysubstituted by C$_1$-C$_{18}$-alkyl and/or the above radicals specified as substituents for alkyl;

(ii) C$_3$-C$_8$-cycloalkyl whose carbon skeleton is optionally interrupted by one or more —O—, —S—, —NR$^1$—, —N═CR$^1$—, —CR$^1$═CR$^1$—, —CO—, —SO— and/or —SO$_2$— moieties and to which are optionally fused further saturated or unsaturated 5- to 7-membered rings whose carbon skeleton is optionally interrupted by one or more —O—, —S—, —NR$^1$—, —N═CR$^1$—, —CR$^1$═CR$^1$—, —CO—, —SO— and/or —SO$_2$— moieties, where the entire ring system may be mono- or polysubstituted by: C$_1$-C$_{18}$-alkyl, C$_1$-C$_{12}$-alkoxy, C$_1$-C$_6$-alkylthio, —C≡CR$^1$, —CR$^1$═CR$^1$$_2$, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$, —SO$_3$R$^2$, —PR$^2$R$^3$ and/or —POR$^2$R$^3$;

(iii) aryl or hetaryl to which is optionally fused at least one further saturated or unsaturated 5- to 7-membered ring whose carbon skeleton is optionally interrupted by one or more —O—, —S—, —NR$^1$—, —N═CR$^1$—, —CR$^1$═CR$^1$—, —CO—, —SO— and/or —SO$_2$— moieties, where the entire ring system is optionally mono- or polysubstituted by: C$_1$-C$_{18}$-alkyl, C$_1$-C$_{12}$-alkoxy, C$_1$-C$_6$-alkylthio, —C≡CR$^1$, —CR$^1$═CR$^1$$_2$, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$, —SO$_3$R$^2$, —PR$^2$R$^3$, —POR$^2$R$^3$, aryl and/or hetaryl, each of which is optionally substituted by C$_1$-C$_{18}$-alkyl, C$_1$-C$_{12}$-alkoxy, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$, —SO$_3$R$^2$, —PR$^2$R$^3$ and/or —POR$^2$R$^3$;

(iv) a —U-aryl radical which is optionally mono- or polysubstituted by the above radicals specified as substituents for the aryl radicals (iii), where U is a —O—, —S—, —NR$^1$—, —CO—, —SO— or —SO$_2$— moiety; and (v) C$_1$-C$_{12}$-alkoxy, C$_1$-C$_6$-alkylthio, —C≡CR$^1$, —CR$^1$═CR$^1$$_2$, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$, —SO$_3$R$^2$, —PR$^2$R$^3$ and/or —POR$^2$R$^3$;

each R' is independently hydrogen;

C$_1$-C$_{30}$-alkyl whose carbon chain is optionally interrupted by one or more —O—, —S—, —NR$^1$—, —N═CR$^1$—, —C≡C—, —CR$^1$═CR$^1$—, —CO—, —SO— and/or —SO$_2$— moieties and which are optionally mono- or polysubstituted by the (ii), (iii), (iv) and/or (v) radicals specified as substituents for the R radicals;

C$_3$-C$_8$-cycloalkyl to which is optionally fused further saturated or unsaturated 5- to 7-membered rings whose carbon skeleton is optionally interrupted by one or more —O—, —S—, —NR$^1$—, —N═CR$^1$—, —CR$^1$═CR$^1$—, —CO—, —SO— and/or —SO$_2$— moieties, where the entire ring system is optionally substituted by the (i), (ii), (iii), (iv) and/or (v) radicals specified as substituents for the R radicals; or aryl or hetaryl to which may be fused further saturated or unsaturated 5- to 7-membered rings whose carbon skeleton is optionally interrupted by one or more —O—, —S—, —NR$^1$—, —N═CR$^1$—, —CR$^1$═CR$^1$—, —CO—, —SO— and/or —SO$_2$— moieties, where the entire ring system is optionally substituted by the (i), (ii), (iii), (iv), (v) radicals specified as substituents for the R radicals, aryl- and/or hetarylazo, each of which may be substituted by C$_1$-C$_{10}$-alkyl, C$_1$-C$_6$-alkoxy and/or cyano;

R$^1$ is hydrogen or C$_1$-C$_{18}$-alkyl, where the R$^1$ radicals are the same or different when they occur more than once;

R$^2$, R$^3$ are each independently hydrogen;

C$_1$-C$_{18}$-alkyl whose carbon chain is optionally interrupted by one or more —O—, —S—, —CO—, —SO— and/or —SO$_2$— moieties and which is optionally mono- or polysubstituted by C$_1$-C$_{12}$-alkoxy, C$_1$-C$_6$-alkylthio, hydroxyl, mercapto, halogen, cyano, nitro and/or —COOR$^1$;

aryl or hetaryl to each of which is optionally fused at least one further saturated or unsaturated 5- to 7-membered ring whose carbon skeleton may be interrupted by one or more —O—, —S—, —CO— and/or —SO$_2$— moieties, where the entire ring system may be mono- or polysubstituted by C$_1$-C$_{12}$-alkyl and/or the above radicals specified as substituents for alkyl;

and where m, m1, n, n1 fulfill at least one of the following conditions:

m=1, m1=0 and n, n1 are integers whose sum adds up to from 5 to 8;

m=1, m1=1 and n, n1 are integers whose sum adds up to from 5 to 12;

m=2, m1=0 and n, n1 are integers whose sum adds up to from 5 to 8.

15. The tetracarboximide or at least one mixture thereof according to claim 14, wherein R and R$^4$ are the same.

16. The tetracarboximide or at least one mixture thereof according to claim 14, wherein R and R$^4$ are each independently aryloxy or arylthio, where the entire ring system is optionally mono- or polysubstituted by the at least one radical selected from the group consisting of (i), (ii), (iii), (iv), and (v).

17. The tetracarboximide or at least one mixture thereof according to claim 14, wherein R and R$^4$ are optionally each independently mono- or polysubstituted by a (i) radical.

18. The tetracarboximide or at least one mixture thereof according to claim 14, wherein R and R$^4$ are each independently

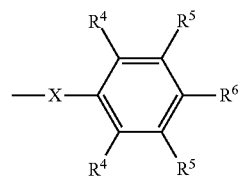

wherein

X is O or S and

R$^4$, R$^5$ and R$^6$ are optionally each independently hydrogen or the at least one radical selected from the group consisting of (i), (ii), (iii), (iv), and (v) with the proviso that at least one of the $R^4$ and $R^6$ radicals is not hydrogen.

19. The tetracarboximide or at least one mixture thereof according to claim 18, wherein either $R^4$ is hydrogen and $R^5$ and $R^6$ are each hydrogen, or $R^6$ is not hydrogen and $R^4$ and $R^5$ are each hydrogen.

20. The tetracarboximide or at least one mixture thereof according to claim 14, wherein each R' is independently $C_1$-$C_{30}$-alkyl or aryl, and wherein the entire ring system is optionally mono- or polysubstituted by the at least one radical selected from the group consisting of (i), (ii), (iii), (iv), and (v).

21. The tetracarboximide or at least one mixture thereof according to claim 14, wherein R' is mono- or polysubstituted by a (i) radical.

22. A pentarylenetetracarboximide of formula (Ia) or at least one mixture thereof,

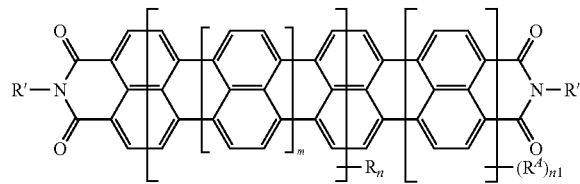

(Ia)

wherein
each R and $R^A$ are independently identical or different radicals selected from the following:
aryloxy, arylthio, hetaryloxy or hetarylthio, to each of which are optionally fused further saturated or unsaturated 5- to 7-membered rings whose carbon skeleton may be interrupted by one or more —O—, —S—, —$NR^1$—, —N=$CR^1$—, —CO—, —SO— and/or —$SO_2$— moieties, wherein the entire ring system is optionally mono- or polysubstituted by at least one radical selected from the group consisting of (i), (ii), (iii), (iv), and (v):

(i) $C_1$-$C_{30}$-alkyl whose carbon chain is optionally interrupted by one or more -O-, -S-, —$NR^1$—, —N=$CR^1$—, —C≡C—, —$CR^1$=$CR^1$—, —CO—, —SO— and/or —$SO_2$— moieties and which are optionally mono- or polysubstituted by: $C_1$-$C_{12}$-alkoxy, $C_1$-$C_6$-alkylthio, —C≡$CR^1$, —$CR^1$=$CR^1_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$, —$POR^2R^3$, aryl and/or saturated or unsaturated $C_4$-$C_7$-cycloalkyl whose carbon skeleton is optionally interrupted by one or more —O—, —S—, —$NR^1$—, —N=$CR^1$—, —$CR^1$=$CR^1$—, —CO—, —SO— and/or —$SO_2$— moieties, where the aryl and cycloalkyl radicals are optionally each mono- or polysubstituted by $C_1$-$C_{18}$-alkyl and/or the above radicals specified as substituents for alkyl;

(ii) $C_3$-$C_8$-cycloalkyl whose carbon skeleton is optionally interrupted by one or more —O—, —S—, —$NR^1$—, —N=$CR^1$—, —$CR^1$=$CR^1$—, —CO—, —SO— and/or —$SO_2$— moieties and to which are optionally fused further saturated or unsaturated 5- to 7-membered rings whose carbon skeleton is optionally interrupted by one or more —O—, —S—, —$NR^1$—, —N=$CR^1$—, —$CR^1$=$CR^1$—, —CO—, —SO— and/or —$SO_2$— moieties, where the entire ring system may be mono- or polysubstituted by: $C_1$-$C_{18}$-alkyl, $C_1$-$C_{12}$-alkoxy, $C_1$-$C_6$-alkylthio, —$CR^1$=$CR^1_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$ and/or —$POR^2R^3$;

(iii) aryl or hetaryl to which is optionally fused at least one further saturated or unsaturated 5- to 7-membered ring whose carbon skeleton is optionally interrupted by one or more —O—, —S—, —$NR^1$—, —N=$CR^1$—, —$CR^1$=$CR^1$—, —CO—, —SO— and/or —$SO_2$— moieties, where the entire ring system is optionally mono- or polysubstituted by: $C_1$-$C_{18}$-alkyl, $C_1$-$C_{12}$-alkoxy, $C_1$-$C_6$-alkylthio, —C≡$CR^1$, —$CR^1$=$CR^1_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$, —$POR^2R^3$, aryl and/or hetaryl, each of which is optionally substituted by $C_1$-$C_{18}$-alkyl, $C_1$-$C_{12}$-alkoxy, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$ and/or —$POR^2R^3$;

(iv) a —U-aryl radical which is optionally mono- or polysubstituted by the above radicals specified as substituents for the aryl radicals (iii), where U is a —O—, —S—, —$NR^1$—, —CO—, —SO— or —$SO_2$— moiety;

(v) $C_1$-$C_{12}$-alkoxy, $C_1$-$C_6$-alkylthio, —C≡$CR^1$, —$CR^1$=$CR^1_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, —$PR^2R^3$ and/or —$POR^2R^3$;

each R' is independently hydrogen;
$C_1$-$C_{30}$-alkyl whose carbon chain is optionally interrupted by one or more —O—, —S—, —$NR^1$—, —N=$CR^1$—, —C≡C—, —$CR^1$=$CR^1$—, —CO—, —SO— and/or —$SO_2$— moieties and which are optionally mono- or polysubstituted by the (ii), (iii), (iv) and/or (v) radicals specified as substituents for the R radicals;
$C_3$-$C_8$-cycloalkyl to which is optionally fused further saturated or unsaturated 5- to 7-membered rings whose carbon skeleton is optionally interrupted by one or more —O—, —S—, —$NR^1$—, —N=$CR^1$—, —$CR^1$=$CR^1$—, —CO—, —SO— and/or —$SO_2$— moieties, where the entire ring system is optionally substituted by the (1), (ii), (iii), (iv) and/or (v) radicals specified as substituents for the R radicals; or
aryl or hetaryl to which may be fused further saturated or unsaturated 5- to 7-membered rings whose carbon skeleton may be interrupted by one or more —O—, —S—, —$NR^1$—, —N=$CR^1$—, —$CR^1$=$CR^1$—, —CO—, —SO— and/or —$SO_2$— moieties, where the entire ring system may be substituted by the (i), (ii), (iii), (iv), (v) radicals specified as substituents for the R radicals, aryl- and/or hetarylazo, each of which may be substituted by $C_1$-$C_{10}$-alkyl, $C_1$-$C_6$-alkoxy and/or cyano;

$R^1$ is hydrogen or $C_1$-$C_{18}$-alkyl, where the $R^1$ radicals are the same or different when they occur more than once;

$R^2$, $R^3$ are each independently hydrogen;

C₁-C₁₈-alkyl whose carbon chain is optionally interrupted by one or more —O—, —S—, —CO—, —SO— and/or —SO₂— moieties and which is optionally mono- or polysubstituted by C₁-C₁₂-alkoxy, C₁-C₈-alkylthio, hydroxyl, mercapto, halogen, cyano, nitro and/or —COOR¹;

aryl or hetaryl to each of which is optionally fused at least one further saturated or unsaturated 5- to 7-membered ring whose carbon skeleton may be interrupted by one or more —O—, —S—, —CO— and/or —SO₂— moieties, where the entire ring system may be mono- or polysubstituted by C₁-C₁₂-alkyl and/or the above radicals specified as substituents for alkyl;

and wherein m=2 and n, n1 are integers whose sum adds up to from 5 to 8.

23. The tetracarboximide or at least one mixture thereof according to claim 22, wherein R and R⁴ are the same.

24. The tetracarboximide or at least one mixture thereof according to claim 22, wherein R and R⁴ are each independently aryloxy or arylthio, where the entire ring system is optionally mono- or polysubstituted by the at least one radical selected from the group consisting of (i), (ii), (iii), (iv), and (v).

25. The tetracarboximide or at least one mixture thereof according to claim 22, wherein R and R⁴ are optionally each independently mono- or polysubstituted by a (i) radical.

26. The tetracarboximide or at least one mixture thereof according to claim 22, wherein R and R⁴ are each independently

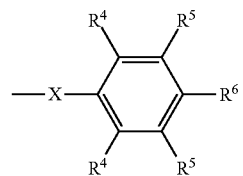

wherein
X is O or S and
R⁴, R⁵ and R⁶ are optionally each independently hydrogen or the at least one radical selected from the group consisting of (i), (ii), (iii), (iv), and (v) with the proviso that at least one of the R⁴ and R⁶ radicals is not hydrogen.

27. The tetracarboximide or at least one mixture thereof according to claim 26, wherein either R⁴ is hydrogen and R⁵ and R⁶ are each hydrogen, or R⁶ is not hydrogen and R⁴ and R⁵ are each hydrogen.

28. The tetracarboximide or at least one mixture thereof according to claim 22, wherein each R' is independently C₁-C₃₀-alkyl or aryl, and wherein the entire ring system is optionally mono- or polysubstituted by the at least one radical selected from the group consisting of (i), (ii), (iii), (iv), and (v).

29. The tetracarboximide or at least one mixture thereof according to claim 22, wherein R' is mono- or polysubstituted by a (i) radical.

* * * * *